United States Patent [19]
Mizuno et al.

[11] Patent Number: 5,742,195
[45] Date of Patent: Apr. 21, 1998

[54] SEMICONDUCTOR INTEGRATED CIRCUIT WITH MOS TRANSISTORS COMPENSATED OF CHARACTERISTIC AND PERFORMANCE DEVIATIONS AND DEVIATION COMPENSATION SYSTEM THEREIN

[75] Inventors: Masayuki Mizuno; Masakazu Yamashina, both of Tokyo, Japan

[73] Assignee: NEC Corporation, Tokyo, Japan

[21] Appl. No.: 597,582

[22] Filed: Feb. 2, 1996

[30] Foreign Application Priority Data

Feb. 10, 1995 [JP] Japan ................... 7-046484

[51] Int. Cl.⁶ .................................................. G06G 7/12
[52] U.S. Cl. ........................... 327/362; 327/332; 327/534
[58] Field of Search .................... 327/331.2, 362, 327/537

[56] References Cited

U.S. PATENT DOCUMENTS

| | | | |
|---|---|---|---|
| 5,397,934 | 3/1995 | Merrill et al. | 327/534 |
| 5,459,426 | 10/1995 | Hori | 327/332 |
| 5,475,325 | 12/1995 | Nezu | 327/362 |
| 5,633,825 | 5/1997 | Sakuta et al. | 327/534 |

OTHER PUBLICATIONS by Tsuguo Kobayashi et al., "Self–Adjusting Threshold––Voltage Scheme (SATS) for Low–Voltage High–Speed Operation", *IEEE 1994 Custom Integrated Circuits Conference.*

*Primary Examiner*—Margaret Rose Wambach
*Attorney, Agent, or Firm*—Young & Thompson

[57] ABSTRACT

A plurality of MOS transistors connected to each other at a substrate electrode thereof to have a substrate potential are deviation-compensated by a combination of a power source having a power source potential independent from the substrate potential, a power supply line connected to a source electrode of each of the MOS transistors, a sample circuit composed of a sampled one of the MOS transistors, detection circuitry for detecting an action of the sample circuit to provide a detection signal representing a difference between the detected action of the sample circuit and a reference action therefor, and a voltage generator connected between the power source and the power supply line, the voltage generator generating a voltage depending on the detection signal.

27 Claims, 16 Drawing Sheets

F I G. 5
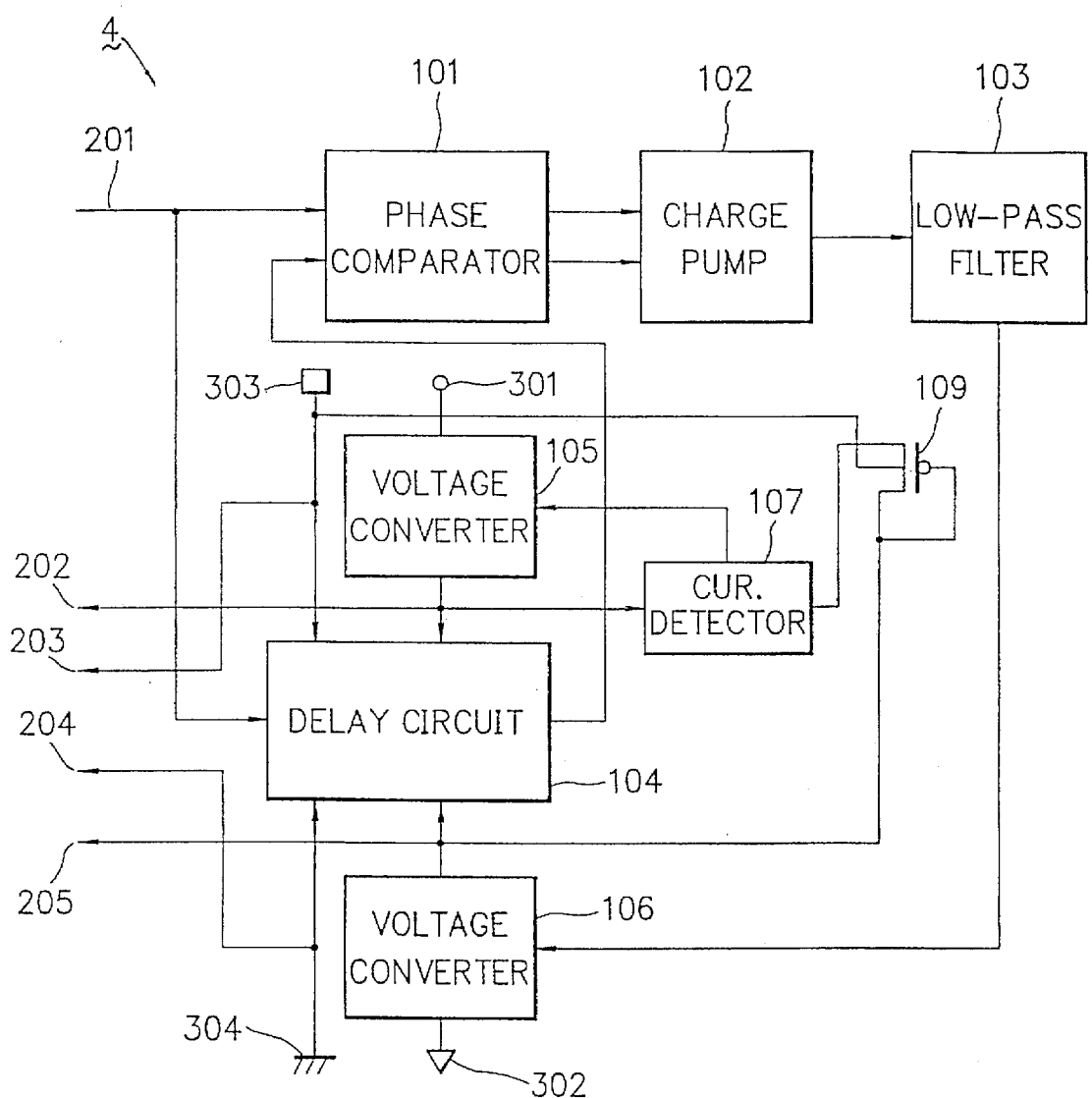

SEMICONDUCTOR INTEGRATED CIRCUIT WITH MOS TRANSISTORS COMPENSATED OF CHARACTERISTIC AND PERFORMANCE DEVIATIONS AND DEVIATION COMPENSATION SYSTEM THEREIN

BACKGROUND OF THE INVENTION

The present invention generally relates to a semiconductor integrated circuit including a multiplicity of metal oxide semiconductor (hereafter "MOS") transistors and a deviation compensation system therein, and particularly, to a semiconductor integrated circuit on a chip including MOS transistors which have varieties of characteristic and/or performance deviations (e.g. dispersed deviations in threshold voltage or in speed of action relative to a desirable value) thereof compensated, as necessary, by an internal compensation system using a number of sampled ones of the MOS transistors, concurrently permitting a reduced complexity in a fabrication process of the integrated circuit, and to a deviation compensation system therein.

1. Description of the Related Art

In general, the semiconductor integrated circuit comprises various types of element devices formed on a chip in a semiconductor fabrication process. Some types of such devices are very large in number, and like devices are concurrently processed in like steps. However, in any such type, most devices have their characteristics and/or performances deviated from desirable values. Such deviations appear as irregularly dispersed characteristics such as due to irregular dimensions or randomly fluctuating actions such as due to variations of a working condition or circumferential factor (hereafter collectively "irregular deviation" or simply "deviation") so that, in a critical case or under a severe criterion, they are compensated in a flexible manner.

For such a compensation of characteristic and/or performance deviations of devices, there have been proposed various systems and techniques. For example, there is discussed a system for compensating a threshold voltage of transistors in the paper "Self-Adjusting Threshold-Voltage Scheme (SATS) for Low-Voltage High-Speed Operation" by T. Kobayashi et al., the Proceedings of the IEEE 1994 Custom Integrated Circuits Conference, pp. 12.3.1–12.3.4

FIG. 1 is a circuit diagram of the conventional threshold voltage compensation system, as it is applied to a semiconductor integrated circuit including a multiplicity of p-channel MOS (hereafter "pMOS") transistors and a multiplicity of n-channel MOS (hereafter "nMOS") transistors.

The conventional compensation system comprises a sampled one of the nMOS transistors (hereafter "sample nMOS transistor") and a feedback circuit for controlling a substrate potential of the sample nMOS transistor.

As shown in FIG. 1, the sample nMOS transistor has a gate electrode thereof supplied with a power supply voltage divided by a potentiometer composed of a pair of voltage-dividing resistors RA and RB, a source electrode thereof grounded, and a drain electrode thereof connected to a load as well as to gate electrodes of an associated one pMOS1 of the pMOS transistors and an associated one nMOS1 of the nMOS transistors.

The pMOS1 transistor is connected at a drain electrode thereof to a source electrode of another associated one nMOS2 of the nMOS transistors, and a drain electrode of the nMOS2 transistor is connected to a source electrode of the nMOS1 transistor. The pMOS1, nMOS2 and nMOS1 transistors are connected in series between a power supply terminal and a ground terminal, cooperatively acting as a limiter to or for setting an initial value of a substrate bias generator.

An interconnection between the pMOS1 transistor and the nMOS2 transistor is connected to an input terminal of the substrate bias generator, of which an output terminal is connected to a substrate electrode of a respective one of the nMOS transistors. Accordingly, an output signal of the bias generator is fed back to the substrate electrode of the sample nMOS transistor. The conventional compensation system thus serves for controlling a substrate potential of the nMOS transistors to thereby compensate irregular deviations of a threshold voltage. Incidentally, as used herein, the threshold voltage is a gate voltage of a MOS transistor when a drain current is thereby reduced to a predetermined cut-off level.

For control of a substrate potential of the pMOS transistors, there is needed another system.

In application of this conventional technique, therefore, a typical semiconductor integrated circuit needs a pair of threshold voltage compensation systems for controlling substrate potentials of pMOS and nMOS transistors, requiring a triple well structure in a semiconductor fabrication process, causing an increased complexity and a reduced cost effect in the process.

Further, the conventional system, in which a leak current of the sample nMOS transistor is employed for a threshold voltage control, tends to have a substrate voltage influenced by fluctuations of the leak current due to temperature variations, failing to ensure a desirable delay characteristic of the transistors supplied with such a substrate voltage.

The present invention has been achieved with such points in mind.

SUMMARY OF THE INVENTION

It therefore is an object of the present invention to provide a semiconductor integrated circuit including MOS transistors compensated of characteristic and/or performance deviations, permitting the MOS transistors to have a plurality of threshold voltages and a semiconductor fabrication process to be reduced of complexity, as well as a deviation compensation system therefor.

It is another object of the present invention to provide a semiconductor integrated circuit in which MOS transistors are permitted to have desirable action speeds free from characteristic deviations and/or circumferential variations, as well as a deviation compensation system therein.

It is still another object of the present invention to provide a semiconductor integrated circuit with deviation-compensated MOS transistors, permitting a reduced chip size and a reduced power consumption, as well as a deviation compensation system therein.

To achieve the objects, a genus of the present invention provides a semiconductor integrated circuit comprising a plurality of MOS transistors connected to each other at a substrate electrode thereof to have a substrate potential, a power source having a power source potential independent from the substrate potential, a power supply line connected to a source electrode of each of the MOS transistors, a sample circuit composed of a sampled one of the MOS transistors, detection means for detecting an action of the sample circuit to provide a detection signal representing a difference between the detected action of the sample circuit and a reference action therefor, and a voltage generator connected between the power source and the power supply line, the voltage generator generating a voltage depending on the detection signal.

According to a species of the genus of the invention, the sample circuit comprises a delay circuit in which the sampled MOS transistor operates for delaying an externally supplied clock signal, the detected action comprises a delay action of the delay circuit, and the reference action comprises a clocking action of the clock signal.

According to an individual of the species of the invention, the detection means comprises a phase comparator connected at an input end thereof to an output end of the delay circuit and a supply line of the clock signal, a charge pump circuit connected at an input end thereof to an output end of the phase comparator, and a low-pass filter connected at an input end thereof to an output end of the charge pump circuit and at an output end thereof to an input end of the voltage generator.

According to another species of the genus of the invention, the sample circuit comprises a diode circuit in which the sampled MOS transistor has a drain electrode thereof and a gate electrode thereof connected to each other, the detected action comprises a current-conducting action of the diode circuit, and the reference action is defined by a predetermined current value.

Further, to achieve the objects, another genus of the present invention provides a semiconductor integrated circuit comprising a plurality of pMOS transistors connected to each other at a substrate electrode thereof to have a first substrate potential, a first power source having a first power source potential independent from the first substrate potential, a first power supply line connected to a source electrode of each of the pMOS transistors, a plurality of nMOS transistors connected to each other at a substrate electrode thereof, a first sample circuit composed of a first sampled one of the pMOS transistors and a first sampled one of the nMOS transistors, first detection means for detecting an action of the first sample circuit to provide a first detection signal representing a first difference between the detected action of the first sample circuit and a first reference action therefor, and a first voltage generator connected between the first power source and the first power supply line, the first voltage generator generating a first voltage depending on the first detection signal.

According to a species of this genus of the invention, the semiconductor integrated circuit further comprises the nMOS transistors each having a second substrate potential at the substrate electrode thereof, a second power source having a second power source potential independent from the second substrate potential, a second power supply line connected to a source electrode of each of the nMOS transistors, a second sample circuit composed of a second sampled one of the pMOS transistors and a second sampled one of the nMOS transistors, second detection means for detecting an action of the second sample circuit to provide a second detection signal representing a second difference between the detected action of the second sample circuit and a second reference action therefor, and a second voltage generator connected between the second power source and the second power supply line, the second voltage generator generating a second voltage depending on the second detection signal.

Further, to achieve the objects, another genus of the present invention provides a semiconductor integrated circuit comprising a plurality of pMOS transistors connected to each other at a substrate electrode thereof, a plurality of nMOS transistors connected to each other at a substrate electrode thereof to have a substrate potential, a power source having a power source potential independent from the substrate potential, a power supply line connected to a source electrode of each of the nMOS transistors, a sample circuit composed of a sampled one of the nMOS transistors and a sampled one of the nMOS transistors, detection means for detecting an action of the sample circuit to provide a detection signal representing a difference between the detected action of the sample circuit and a reference action therefor, and a voltage generator connected between the power source and the power supply line, the voltage generator generating a voltage depending on the detection signal.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between the second power source voltage and an output voltage of a voltage converter so that the input signal to the delay circuit is delayed by a predetermined time to be output therefrom, a phase comparator for outputting a signal depending on a difference between a phase of the signal obtained from the clock signal line and a phase of the signal output from the delay circuit, a charge pump circuit receiving the signal output from the phase comparator, as an input thereto, a low-pass filter receiving a signal output from the charge pump circuit, as an input thereto, the voltage converter generating the output voltage thereof having a potential difference variable relative to the first power source voltage in dependence on a change of a signal output from the low-pass filter, an internal signal line as a power supply line for source electrodes of the others of the pMOS transistors, the internal signal line being supplied with the output voltage of the voltage converter, a first subsidiary power supply line for substrate electrodes of said others of the pMOS transistors, the first subsidiary power supply line being connected to the third power source, and a second subsidiary power supply line for substrate electrodes of the others of the nMOS transistors, the second substrate power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between the first power source voltage and an output voltage of a voltage converter so that the input signal to the delay circuit is delayed by a predetermined time to be output therefrom, a phase comparator for outputting a signal depending on a difference between a phase of the signal obtained from the clock signal line and a phase of the signal output from the delay circuit, a charge pump circuit receiving the signal output from the phase comparator, as an input thereto, a low-pass filter receiving a signal output from the charge pump circuit, as an input thereto, the voltage converter generating the output voltage thereof having a potential difference variable relative to the second power source voltage in dependence on a change of a signal output from the low-pass filter, an internal signal line as a power supply line for source electrodes of the others of the pMOS transistors, the internal signal line being supplied with the output voltage of the voltage converter, a first subsidiary power supply line for substrate electrodes of said others of the pMOS transistors, the first subsidiary power supply line being connected to the third power source, and a second subsidiary power supply line for substrate electrodes of the others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a sampled one of the pMOS transistors, a first internal power supply line for source electrodes of the others of the pMOS transistors, a sampled one of the nMOS transistors, a second internal power supply line for source electrodes of the others of the nMOS transistors, the sampled pMOS transistor having a substrate electrode thereof connected to the third power source and a drain electrode and a gate electrode thereof connected to the second internal power supply line, a first current detection circuit for outputting a signal depending on a current conducted between a source electrode of the sampled pMOS transistor and the first internal power supply line, a first voltage converter for generating to output a voltage having a potential difference variable relative to the first power source voltage in dependence on a change of the signal output from the first current detection circuit, the first internal power supply line being supplied with the voltage output from the first voltage converter, the sampled nMOS transistor having a substrate electrode thereof connected to the fourth power source and a drain electrode and a gate electrode thereof connected to the first internal power supply line, a second current detection circuit for outputting a signal depending on a current conducted between a source electrode of the sampled nMOS transistor and the second internal power supply line, a second voltage converter for generating to output a voltage having a potential difference variable relative to the second power source voltage in dependence on a change of the signal output from the second current detection circuit, the second internal power supply line being supplied with the voltage output from the second voltage converter, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between an output voltage of a first voltage converter and an output voltage of a second voltage converter so that the input signal to the delay circuit is delayed by a predetermined time to be output therefrom, a phase comparator for outputting a signal depending on a difference between a phase of the signal obtained from the clock signal line and a phase of the signal output from the delay circuit, a charge pump circuit receiving the signal output from the phase comparator, as an input thereto, a low-pass filter receiving a signal output from the charge pump circuit, as an input thereto, the second voltage converter generating the output voltage thereof having a potential difference variable relative to the second power source voltage in dependence on a change of a signal output from the low-pass filter, a sampled one of the pMOS transistor, a first internal power supply line for source electrodes of the others of the pMOS transistors, a second internal power supply line for source electrodes of the others of the nMOS transistors, the second internal power supply line being supplied with the output voltage of the second voltage converter, the sampled pMOS transistor having a substrate electrode thereof connected to the third power source and a drain electrode and a gate electrode thereof connected to the second internal power supply line, a current detection circuit for outputting a signal depending on a current conducted between a source electrode of the sampled pMOS transistor and the first internal power supply line, the first voltage converter generating the output voltage thereof having a potential difference variable relative to the first power source voltage in dependence on a change of the signal output from the current detection circuit, the first internal power supply line being supplied with the output voltage of the first voltage converter, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between an output voltage of a first voltage converter and an output voltage of a second voltage converter so that the input signal to the delay circuit is delayed by a predetermined time to be output therefrom, a phase comparator for outputting a signal depending on a difference between a phase of the signal obtained from the clock signal line and a phase of the signal output from the delay circuit, a charge pump circuit receiving the signal output from the phase comparator, as an input thereto, a low-pass filter receiving a signal output from the charge pump circuit, as an input thereto, the first voltage converter generating the output voltage thereof having a potential difference variable relative to the first power source voltage in dependence on a change of a signal output from the low-pass filter, a first internal power supply line for source electrodes of the others of the pMOS transistors, the first internal power supply line being supplied with the output voltage of the first voltage converter, a sampled one of the nMOS transistor, a second internal power supply line for source electrodes of the others of the nMOS transistors, the sampled nMOS transistor having a substrate electrode thereof connected to the fourth power source and a drain electrode and a gate electrode thereof connected to the first internal power supply line, a current detection circuit for outputting a signal depending on a current conducted between a source electrode of the sampled nMOS transistor and the second internal power supply line, the second voltage converter generating the output voltage thereof having a potential difference variable relative to the second power source voltage in dependence on a change of the signal output from the current detection circuit, the second internal power supply line being supplied with the output voltage of the second voltage converter, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first delay circuit receiving a signal obtained from a clock signal line, as an input signal thereto, and being operated with a power supply voltage substantially equivalent to a potential difference between an output voltage of a first voltage converter and an output voltage of a second voltage converter so that the input signal to the first delay circuit is delayed by a first predetermined time to be output therefrom, a first phase comparator for outputting a signal depending on a difference between a phase of the signal obtained from the clock signal line and a phase of the signal output from the first delay circuit, a first charge pump circuit receiving the signal output from the first phase comparator, as an input thereto, a first low-pass filter receiving a signal output from the first charge pump circuit, as an input thereto, the second voltage converter generating the output voltage thereof having a potential difference variable relative to the second power source voltage in dependence on a change of a signal output from the first low-pass filter, a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second pMOS transistor having a larger gate width than the second nMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom, a third delay circuit composed of a plurality of third basic gates each consisting of a third one of the pMOS transistors having the third power source voltage as a substrate voltage thereof and a third one of the nMOS transistors having the fourth power source voltage as a substrate voltage thereof, the third nMOS transistor having a larger gate width than the third pMOS transistor, the third delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the third delay circuit is delayed by a third predetermined time to be output therefrom, a second phase comparator for outputting a signal depending on a difference between a phase of the signal output from the second delay circuit and a phase of the signal output from the third delay circuit, a second charge pump circuit receiving the signal output from the second phase comparator, as an input thereto, a second low-pass filter receiving a signal output from the second charge pump circuit, as an input thereto, the first voltage converter generating the output voltage thereof having a potential difference variable relative to the first power source voltage in dependence on a change of a signal output from the second low-pass filter, a first internal power supply line for source electrodes of the others of the pMOS transistors, the first internal power supply line being supplied with the output voltage of the first voltage converter, a second internal power supply line for source electrodes of the others of the nMOS transistors, the second internal power supply line being supplied with the output voltage of the second voltage converter, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first delay circuit receiving a signal obtained from a clock signal line, as an input signal thereto, and being operated with a power supply voltage substantially equivalent to a potential difference between an output voltage of a first voltage converter and an output voltage of a second voltage converter so that the input signal to the first delay circuit is delayed by a first predetermined time to be output therefrom, a first phase comparator for outputting a signal depending on a difference between a phase of the signal obtained from the clock signal line and a phase of the signal output from the first delay circuit, a first charge pump circuit receiving the signal output from the first phase comparator, as an input thereto, a first low-pass filter receiving a signal output from the first charge pump circuit, as an input thereto, the first voltage converter generating the output voltage thereof having a potential difference variable relative to the first power source voltage in dependence on a change of a signal output from the first low-pass filter, a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second pMOS transistor having a larger gate width than the second nMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom, a third delay circuit composed of a plurality of third basic gates each consisting of a third one of the pMOS transistors having the third power source voltage as a substrate voltage thereof and a third one of the nMOS transistors having the fourth power source voltage as a substrate voltage thereof, the third nMOS transistor having a larger gate width than the third pMOS transistor, the third delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the third delay circuit is delayed by a third predetermined time to be output therefrom, a second phase comparator for outputting a signal depending on a difference between a phase of the signal output from the second delay circuit and a phase of the signal output from the third delay circuit, a second charge pump circuit receiving the signal output from the second phase comparator, as an input thereto, a second low-pass filter receiving a signal output from the second charge pump circuit, as an input thereto, the second voltage converter generating the output voltage thereof having a potential difference variable relative to the second power source voltage in dependence on a change of a signal output from the second low-pass filter, a first internal power supply line for source electrodes of the others of the pMOS transistors, the first internal power supply line being supplied with the output voltage of the first voltage converter, a second internal power supply line for source electrodes of the others of the nMOS transistors, the second internal power supply line being supplied with the output voltage of the second voltage converter, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a first internal power supply line supplied with an output voltage of a first voltage converter, a second internal power supply line supplied with an output voltage of a second voltage converter, a sampled one of the pMOS transistors having a substrate electrode thereof connected to the third power source and a drain electrode and a gate electrode thereof connected to the second internal power supply line, a current detection circuit for outputting a signal depending on a current conducted between a source electrode of the sampled pMOS transistor and the first internal power supply line, the first voltage converter generating the output voltage thereof having a potential difference variable relative to the first power source voltage in dependence on a change of the signal output from the current detection circuit, a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first pMOS transistor having a larger gate width than the first nMOS transistor, the first delay circuit receiving a signal obtained from a clock signal line, as an input signal thereto, and being operated with a power supply voltage substantially equivalent to a potential difference between the output voltage of the first voltage converter and the output voltage of the second voltage converter so that the input signal to the first delay circuit is delayed by a first predetermined time to be output therefrom, a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second nMOS transistor having a larger gate width than the second pMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom, a phase comparator for outputting a signal depending on a difference between a phase of the signal output from the first delay circuit and a phase of the signal output from the second delay circuit, a charge pump circuit receiving the signal output from the phase comparator, as an input thereto, a low-pass filter receiving a signal output from the charge pump circuit, as an input thereto, the second voltage converter generating the output voltage thereof having a potential difference variable relative to the second power source voltage in dependence on a change of a signal output from the low-pass filter, the first internal power supply line being provided as a power supply line for source electrodes of the others of the pMOS transistors, the second internal power supply line being provided as a power supply line for source electrodes of the others of the nMOS transistors, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

Furthermore, to achieve the objects described, another genus of the present invention provides a deviation compensation system in a semiconductor integrated circuit including a plurality of pMOS transistors and a plurality of nMOS transistors, the system comprising a first power source having a first power source voltage, a second power source having a second power source voltage, a third power source having a third power source voltage, a fourth power source having a fourth power source voltage, a first internal power supply line supplied with an output voltage of a first voltage converter, a second internal power supply line supplied with an output voltage of a second voltage converter, a sampled one of the nMOS transistors having a substrate electrode thereof connected to the fourth power source and a drain electrode and a gate electrode thereof connected to the first internal power supply line, a current detection circuit for outputting a signal depending on a current conducted between a source electrode of the sampled nMOS transistor and the second internal power supply line, the second voltage converter generating the output voltage thereof having a potential difference variable relative to the second power source voltage in dependence on a change of the signal output from the current detection circuit, a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first pMOS transistor having a larger gate width than the first nMOS transistor, the first delay circuit receiving a signal obtained from a clock signal line, as an input signal thereto, and being operated with a power supply voltage substantially equivalent to a potential difference between the output voltage of the first voltage converter and the output voltage of the second voltage converter so that the input signal to the first delay circuit is delayed by a first predetermined time to be output therefrom, a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second nMOS transistor having a larger gate width than the second pMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom, a phase comparator for outputting a signal depending on a difference between a phase of the signal output from the first delay circuit and a phase of the signal output from the second delay circuit, a charge pump circuit receiving the signal output from the phase comparator, as an input thereto, a low-pass filter receiving a signal output from the charge pump circuit, as an input thereto, the first voltage converter generating the output voltage thereof having a potential difference variable relative to the first power source voltage in dependence on a change of a signal output from the low-pass filter, the first internal power supply line being provided as a power supply line for source electrodes of the others of the pMOS transistors, the second internal power supply line being provided as a power supply line for source electrodes of the others of the nMOS transistors, a first subsidiary power supply line for substrate electrodes of said others of the pMOS transistors, the first subsidiary power supply line being connected to the third power source, and a second subsidiary power supply line for substrate electrodes of said others of the nMOS transistors, the second subsidiary power supply line being connected to the fourth power source.

According to the present invention, therefore, a semiconductor integrated circuit includes a plurality of MOS transistors formed in a semiconductor fabrication process, as pMOS or nMOS transistors operable with an identical drive current that may be developed irrespective of channel widths.

Accordingly, the channel widths may be designed to be as small as possible by available techniques in the fabrication process, permitting a reduced consumption of power as well as a reduced heat dissipation.

In other words, according to the present invention, techniques for a phase locked loop (hereafter "PLL") are combined with a so-called substrate effect of MOS transistor to provide a semiconductor integrated circuit permitting a desirable action speed to be achieved irrespective of characteristic deviations of devices as well as of circumferential variations, a semiconductor fabrication process to have a reduced complexity, MOS transistors with a plurality of threshold voltages to be employed therein.

In particular, the possible application of an identical drive current to pMOS transistors as well as to nMOS transistors irrespective of channel widths of the transistors allows a design channel width of pMOS transistors as well as of nMOS transistors to be reduced in size to a minimum value achievable by associated process techniques, permitting an effective reduction in power consumption of the semiconductor integrated circuit.

More specifically, a plurality of basic gate circuits such as inverters with typical loads are cascaded to be controlled by a PLL technique to have a desirable delay time achieved between input and output ends thereof.

The delay time through the basic gate circuits is controllable by making use of a substrate effect (sometimes called "substrate bias effect") of an employed MOS transistor therein to change a threshold voltage thereof.

In a case of an nMOS transistor, the threshold voltage has a larger value as a substrate potential of the transistor becomes lower than a source potential thereof, and it has a smaller value as the substrate potential becomes higher than the source potential.

To the contrary, in a case of a pMOS transistor, the threshold voltage has a smaller value as a substrate potential of the transistor becomes lower than a source potential thereof, and it has a larger value as the substrate potential becomes higher than the source potential.

In this respect, in a conventional semiconductor integrated circuit in which e.g. an inverter circuit includes an nMOS transistor and a pMOS transistor, the inverter circuit is operated by fixing respective potentials of a substrate terminal and a source terminal of the nMOS transistor to a ground potential, and those of a substrate terminal and a source terminal of the pMOS transistor to a power source potential.

However, in a semiconductor integrated circuit according to the invention in which e.g. an inverter circuit includes an nMOS transistor and a pMOS transistor, a substrate terminal of the nMOS transistor is fixed to a ground potential and that of the pMOS transistor is fixed to a power source potential, while a source terminal of the nMOS transistor and that of the pMOS transistor are each respectively supplied with a voltage generated at a voltage converter controlled by a PLL technique.

That is, a plurality of basic gate circuits such as inverters with typical loads are cascaded to be controlled in accordance with a PLL technique to have a desirable delay time achieved, by controlling a voltage converter at a source end of nMOS transistors therein and another voltage converter at a source end of pMOS transistors therein to provide the nMOS transistors with a controlled source potential and the pMOS transistors with a controlled source potential, respectively.

In a semiconductor integrated circuit according to the invention, the voltages generated at the voltage converters are supplied as power supply voltages to MOS transistors which have substrate potentials thereof set up in the same or analogous manner as the nMOS and pMOS transistors in the basic gate circuits, permitting desirable action speeds to be achieved free of influences due to characteristic deviations and/or circumferential variations. Moreover, the MOS transistors are permitted to have a plurality of threshold voltages, without an increased complexity in an associated semiconductor fabrication process.

Further, in a semiconductor integrated circuit according to the invention, like effects are achieved by detecting an on-state current of a sample nMOS to provide a detection signal for which a voltage converter is responsible to generate a potential to be supplied as a source potential to nMOS transistors, and by detecting an on-state current of a sample pMOS to provide another detection signal for which another voltage converter is responsible to generate a potential to be supplied as a source potential to pMOS transistors.

Still more, in a semiconductor integrated circuit according to the invention, a PLL technique is applied to a combination of a delay circuit composed of a plurality of cascaded inverter circuits each including a pMOS transistor and an nMOS transistor having a sufficiently larger channel width than the pMOS transistor and another delay circuit composed of a plurality of cascaded inverter circuits each including an nMOS transistor and a pMOS transistor having a sufficiently larger channel width than this nMOS transistor, to have a desirable delay time achieved between their inputs and outputs by controlling a voltage converter at a source end of the nMOS transistors and another voltage converter at a source end of the pMOS transistors, to adjust their threshold voltages so that the nMOS and pMOS transistors have identical drive currents irrespective of their channel widths, thus permitting their channel widths to be designed with a minimum available size in an associated semiconductor fabrication process, resulting a reduced power consumption.

Yet more, according to the invention, a double well structure is applicable to a semiconductor integrated circuit including a deviation compensation system.

BRIEF DESCRIPTION OF THE DRAWINGS

The objects, features and advantages of the present invention will become more apparent from consideration of the following detailed description, in conjunction with the accompanying drawings, in which:

FIG. 5 is a block diagram of a deviation compensation system in a semiconductor integrated circuit according to another embodiment of the invention;

DESCRIPTION OF THE PREFERRED EMBODIMENTS

Figure 1:
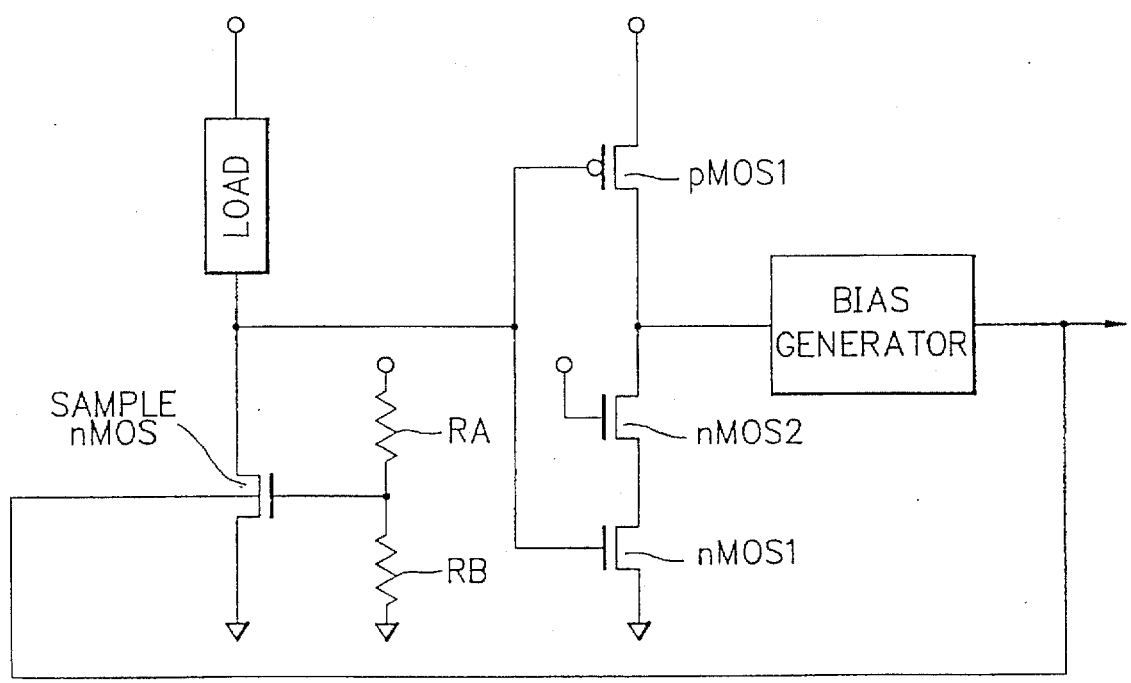
FIG. 1 is a circuit diagram of a conventional deviation compensation system.

There will be detailed below preferred embodiments of the present invention with reference to the accompanying drawings. Like members are designated by like reference characters.

Figure 2:
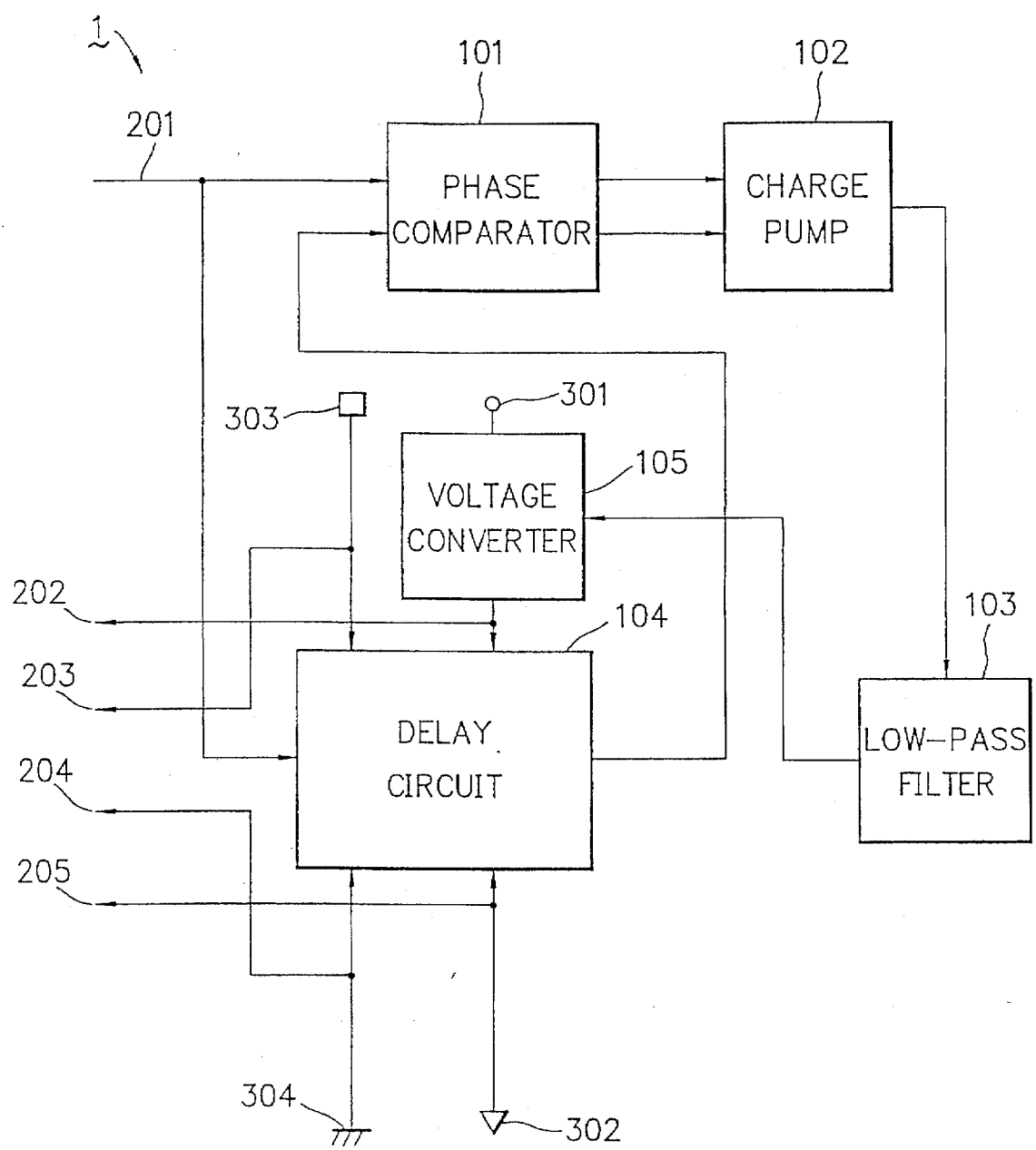
FIG. 2 is a block diagram of a deviation compensation system in a semiconductor integrated circuit according to an embodiment of the invention.

FIG. 2 is a block diagram of a deviation compensation system 1 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process. Such the transistors are voluntarily selected to be employed as pMOS and nMOS transistors in the deviation compensation system 1.

As shown in FIG. 2, the deviation compensation system 1 includes a delay circuit 104 receiving a clock signal obtained from a clock signal line 201, as an input thereto, for giving it a certain delay to output a delayed clock signal, and a phase comparator 101 for outputting a signal depending on a difference between a phase of the signal obtained from the clock signal line 201 and a phase of the output signal of the delay circuit 104.

The compensation system 1 further includes a charge pump circuit 102 receiving the output signal of the phase comparator 101, as an input thereto, a low-pass filter 103 receiving an output signal of the charge pump circuit 102, as an input thereto, and a first voltage converter 105 for generating an output voltage, as a potential difference varying relative to a first power source 301 in dependence on an increasing or decreasing variation of an output signal of the low-pass filter 103, to supply the same to a first internal power supply line 202.

The system 1 still further includes a first subsidiary power supply line 203 connected to a third power source 303, and a second subsidiary power supply line 204 connected to a fourth power source 304.

The clock signal from the clock signal line 201 serves as an externally supplied reference signal. The first power source 301 may be a power supply voltage line (Vdd). The second power source 302 may have a grounded potential (GND). The third and fourth power sources 303 and 304 serve as bias sources, respectively, and the first and second subsidiary power source lines are provided for supplying bias potentials, respectively.

The delay circuit 104 comprises a plurality of basic gate circuits, whereto the clock signal from the clock signal line 201 is input. The basic gate circuits are operable with a power supply voltage corresponding to a potential difference between the output voltage of the first voltage converter 105 and a voltage of the second power source 302. Each gate circuit is composed of a pMOS transistor having the potential of the third power source 303 as a substrate potential thereof and an nMOS transistor having the potential of the fourth power source 304 as a substrate potential thereof.

Figure 11:
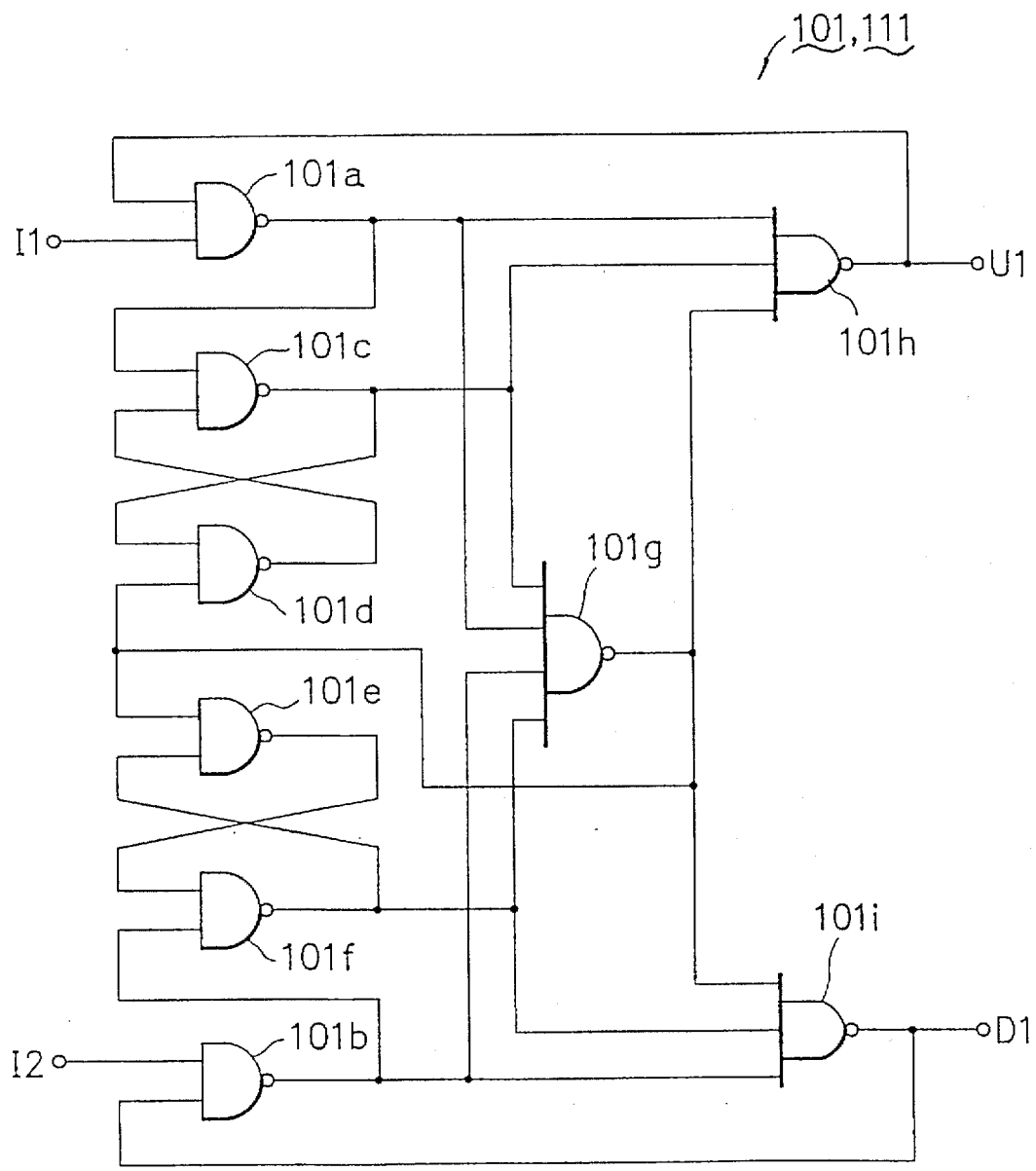
FIG. 11 is a circuit diagram of an example of a phase comparator for use in embodiments of the invention.

FIG. 11 exemplarily shows a circuit diagram of the phase comparator 101 in the system 1.

The phase comparator 101 of FIG. 11 comprises a total of six 2-input/1-output NAND gates 101a to 101f, a single 4-input/1-output NAND gate 101g and a pair of 3-input/1-output NAND gates 101h and 101i. The NAND gate 101a is connected at one input thereof to an input terminal I1 of the comparator 101, at the other input thereof to an output of the NAND gate 101h, and at an output thereof to one input of the NAND gate 101c, one input of the NAND gate 101g and one input of the NAND gate 101h.

Likewise, the NAND gate 101b is connected at one input thereof to another input terminal I2 of the comparator 101, at the other input thereof to an output of the NAND gate 101i, and at an output thereof to one input of the NAND gate 101f, another input of the NAND gate 101g and one input of the NAND gate 101i.

The NAND gate 101c is connected at the other input thereof to an output of the NAND gate 101d, and at an output thereof to one input of the NAND gate 101d, still another input of the NAND gate 101g and another input of the NAND gate 101h. The NAND gate 101f is connected at the other input thereof to an output of the NAND gate 101e, and at an output thereof to one input of the NAND gate 101e, the remaining input of the NAND gate 101g and another input of the NAND gate 101i.

The gate 101g is connected at an output thereof to the other input of the gate 101d, the other input of the gate 101e, the remaining input of the gate 101h and the remaining input of the gate 101i. Then, the outputs of the gates 101h and 101i are connected to output terminals U1 and D1 of the comparator 101, respectively.

Therefore, the phase comparator 101 of FIG. 11 is constituted as a sequential circuit with internal flip-flops. A signal state to be observed at the output end (U1, D1) of the comparator 101 is changed in dependence on a signal state at the input end (I1, I2) and on a previous signal state of the comparator 101.

For example, assuming a previous state in which I1="1" and I2="1" at the input end and U1="0" and D1="1" at the output end, if the signal state at the input end is changed to a state of I1="1" and I2="0", i.e. if the input I2 is changed from "1" to "0", then the signal state at the output end becomes U1="0" and D1="0".

In this respect, in the phase comparator 101 of a digital type shown in FIG. 11, if and only when an input signal is changed from "1" to "0", there appears a change in an output signal. In this case the input signal is changed from "0" to "1", no change occurs in the signal state at the output end. It therefore is unnecessary for the input signal to have a waveform of a 50% duty.

Figure 12:
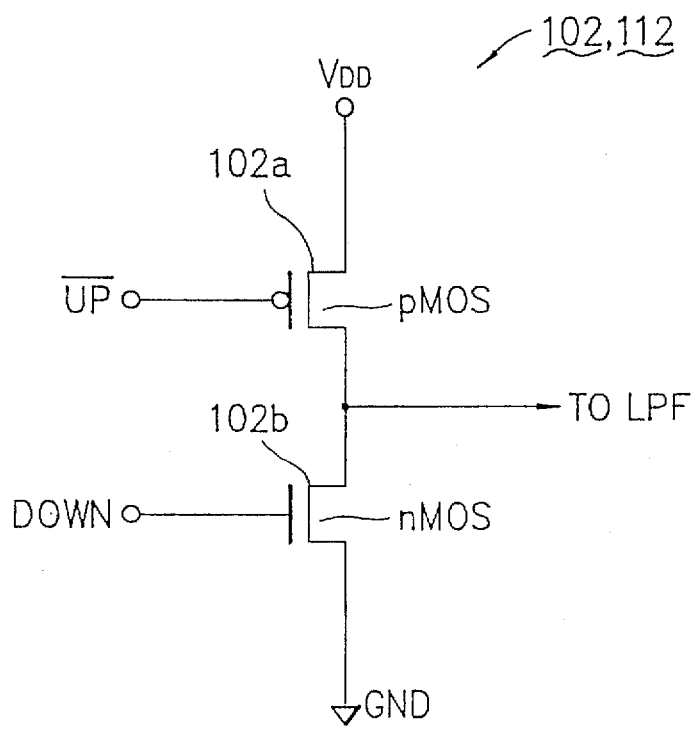
FIG. 12 is a circuit diagram of an example of a charge pump circuit for use in embodiments of the invention.

FIG. 12 exemplarily shows a circuit diagram of the charge pump circuit 102 in the system 1.

The charge pump circuit 102 of FIG. 12 comprises a pMOS transistor 102a and an nMOS transistor 102b serially connected between a power supply terminal Vdd and a ground terminal GND. The pMOS transistor 102a and the nMOS transistor 102b have gate electrodes thereof connected via input terminals UP ("‾" means "low active") and DOWN to the output terminals U1 and D1 of the phase comparator 101, respectively. Drain electrodes of the pMOS and nMOS transistors 102a and 102b have an interconnection therebetween, which is connected via an output terminal of the cirucit 102 to the low-pass filter 103.

When the input terminal UP has an active level, the pMOS transistor 102a is turned on (current-conductive) so that a connected capacitor at the output end of the circuit 102 (e.g. a later-described capacitor of the low-pass filter 103) is charged with electricities developing an ascended potential. If the input terminal DOWN is active, the nMOS transistor 102b is turned on (current-conductive) so that the connected capacitor at the output end discharges, with a descending potential.

Figure 13:
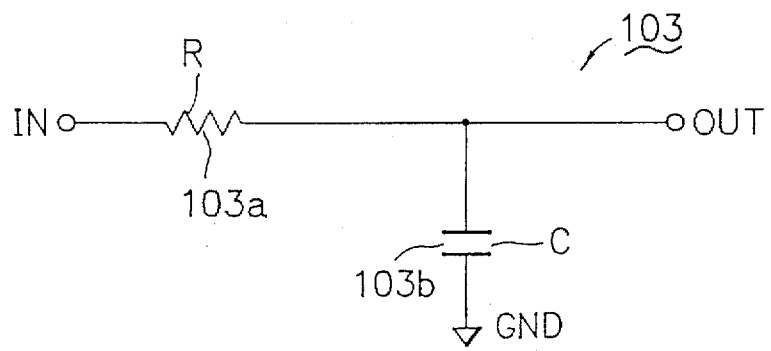
FIG. 13 is a circuit diagram of an example of a low-pass filter for use in embodiments of the invention.

FIG. 13 exemplarily shows a circuit diagram of the low-pass filter 103 in the system 1.

The low-pass filter 103 of FIG. 13 comprises a resistor 103a (with a resistance R) R connected between an input terminal IN and an output terminal OUT of the filter 103, and a capacitor 103b (with a capacitance C) connected between the output terminal OUT and a ground terminal GND. The input terminal IN is connected to the output terminal of the charge pump circuit 102. The capacitor C charges therein and discharges therefrom a quantity of electricities depending on an output of the charge pump circuit 102, in accordance with a time constant of which a value is determined from the resistance R and the capacitance C as well known.

Figure 14:
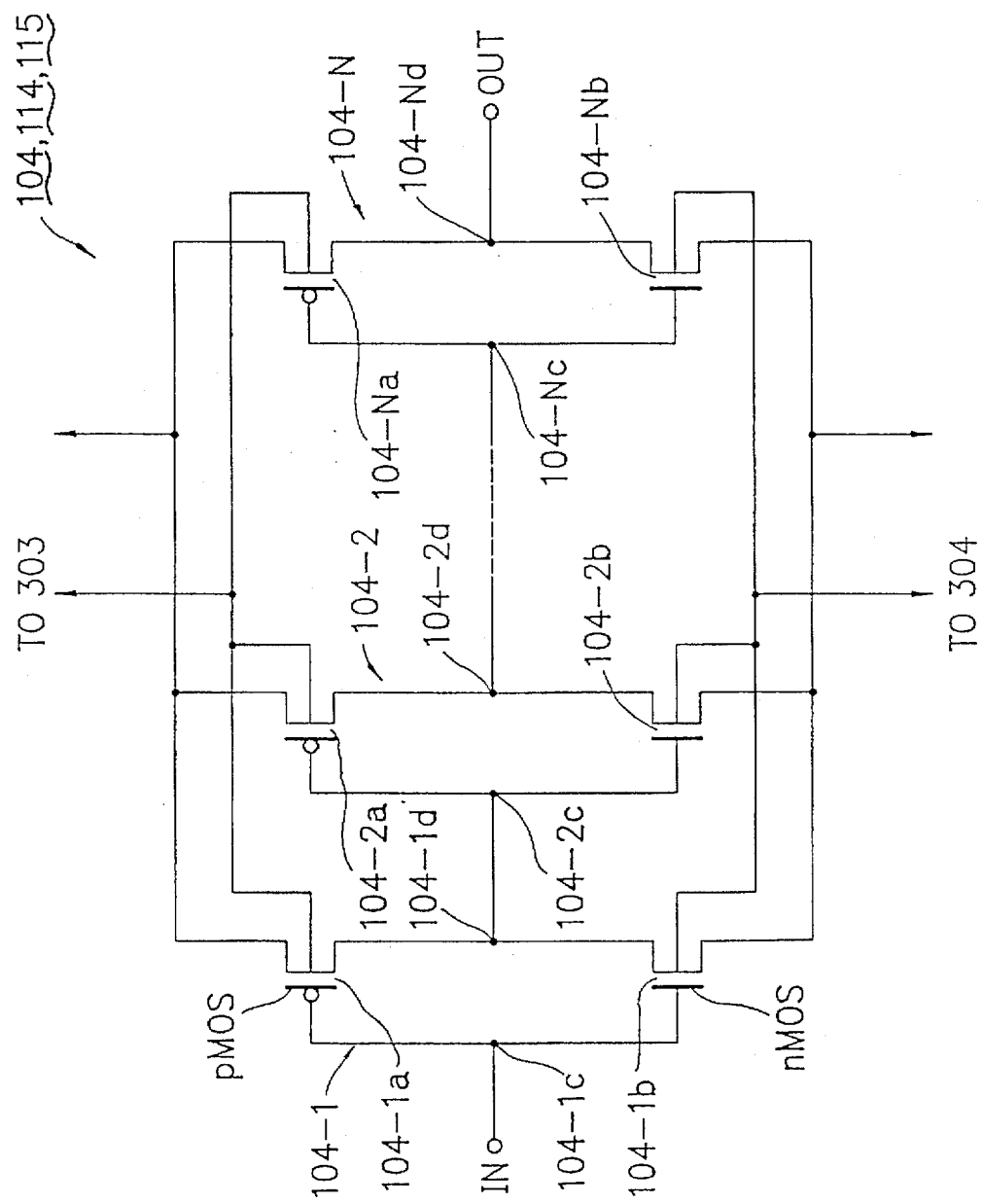
FIG. 14 is a circuit diagram of an example of a delay circuit for use in embodiments of the invention.

FIG. 14 exemplarily shows a circuit diagram of the delay circuit 104 in the system 1.

The delay circuit 104 of FIG. 14 comprises a plurality of cascaded basic gates 104-$i$ as CMOS inverters each composed of a pMOS transistor 104-$ia$ and an nMOS transistor 104-$ib$, where i is an arbitrary integer such that $1 \leq i \leq N$, where N is a predetermined positive integer larger than unity.

In each gate 104-$i$, the pMOS and nMOS transistors 104-$ia$ and 104-$ib$ have gate electrodes thereof interconnected at an input node 104-$ic$ and drain electrodes thereof interconnected at an output node 104-$id$. An input terminal IN of the delay circuit 104 is connected to the input node 104-1$c$ of a first gate 104-1, and the output node 104-Nd of a last gate 104-N is connected to an output terminal OUT of the circuit 104. The output node 104-$id$ of any gate 104-$i$ ($i \leq N-1$) is connected to the input node 104-(i+1)$c$ of a subsequent gate 104-(i+1).

Each pMOS transistor 104-$ia$ has a substrate voltage thereof supplied from the third power source 303, and each nMOS transistor 104-$ib$ has a substrate voltage thereof supplied from the fourth power source 304.

In the case of system 1, a source electrode of each pMOS transistor 104-$ia$ is connected to the first voltage converter 105, and a source electrode of each nMOS transistor 104-$ib$ is connected to the second power source 304.

Figure 15:
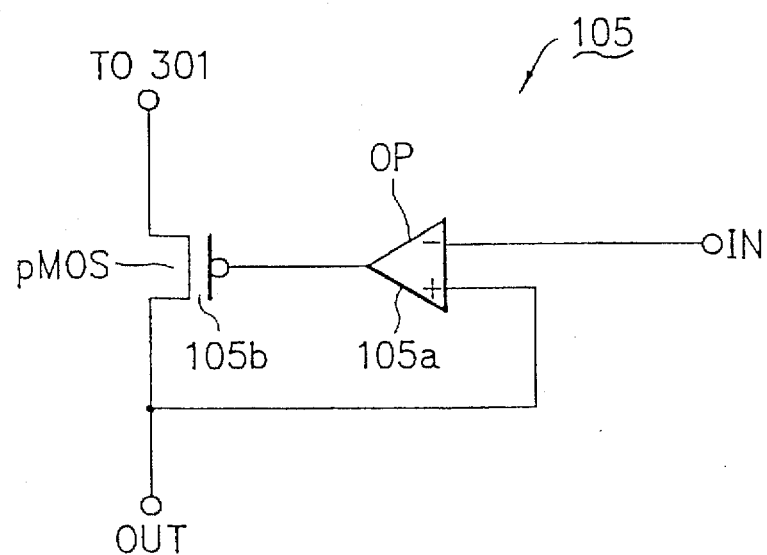
FIG. 15 is a circuit diagram of an example of a voltage converter for use in embodiments of the invention.

FIG. 15 exemplarily shows a circuit diagram of the first voltage converter 105 in the system 1.

The voltage converter 105 of FIG. 15 comprises an operation amplifier (hereafter sometimes simply "OP") 105$a$ and a pMOS transistor 105$b$ operable as a driving amplifier.

The operation amplifier 105$a$ is connected at an inverted (−) input terminal thereof to an input terminal IN of the voltage converter 105, and at a non-inverted (+) input terminal thereof to an output terminal OUT of the converter 105.

The pMOS transistor 105$b$ is connected at a gate electrode thereof to an output terminal of the OP 105$a$, at a source electrode thereof to the first power source 301 and at a drain electrode thereof to the output terminal OUT of the converter 105, so that an output of the transistor 105$b$ is fed back to the non-inverted input terminal of the OP 105$a$.

In the system 1, as the input terminal IN of the converter 105 is connected to the output terminal of the low-pass filter 103, the converter 105 outputs at the terminal OUT a potential depending on an output potential of the filter 103.

As shown in FIG. 2, in the system 1, a delay time between an input and an output of the delay circuit 104 is controlled to be equivalent to a period of the clock signal input from the clock signal line 201, by a combination of the phase comparator 101, the charge pump circuit 102, the low-pass filter 103 and the first voltage converter 105.

The first internal power supply line 202 has a potential developed thereon by a combination of the first power source 301 and the first voltage converter 105 (See FIG. 15). The second internal power supply line 205 has a potential developed thereon by the second power source 302.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay time between input and output of the delay circuit 104 is controllable by the first voltage converter 105.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the MOS transistors in the delay circuit 104 so that an action speed of the compensated system is representable by a delay time between input and output of the delay circuit 104.

If the delay time between input and output of the delay circuit 104 is controlled to be equivalent to the period of the clock signal of the clock signal line 201 by the phase comparator 101, the charge pump circuit 102, the low-pass filter 103 and the first voltage converter 105, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the MOS transistors in basic gates of the delay circuit 104, in a manner in which the delay time between input and output of the circuit 104 that represents a delay characteristic of each basic gate is PLL-adjusted to a desirable action speed, thus permitting an effective compensation against the fluctuation tendency.

Incidentally, the conventional compensation system shown in FIG. 1 needs a triple well structure to be formed in a semiconductor fabrication process, causing an increased produciton cost.

However, the semiconductor integrated circuit including the compensation system of FIG. 2 can be formed by using a double well structure, while permitting an effective deviation compensation of threshold values of pMOS transistors and nMOS transistors to a competent degree to the conventional case.

The semiconductor integrated circuit of FIG. 2 may be paired to have a first subsidiary power supply line common therebetween and a second subsidiary power supply line common therebetween, permitting a formation of a plurality of types of nMOS transistors different of threshold value from each other without an additional step to the fabrication process.

Like effects may be achieved by the semiconductor integrated circuit of FIG. 2, as the first power source 301 and the second power source 302 are common to the third power source 303 and the fourth power source 304, respectively.

It will be seen that the circuits illustrated in FIGS. 11 to 15 are mere embodied examples for a facilitated comprehension of the invention.

Figure 3:
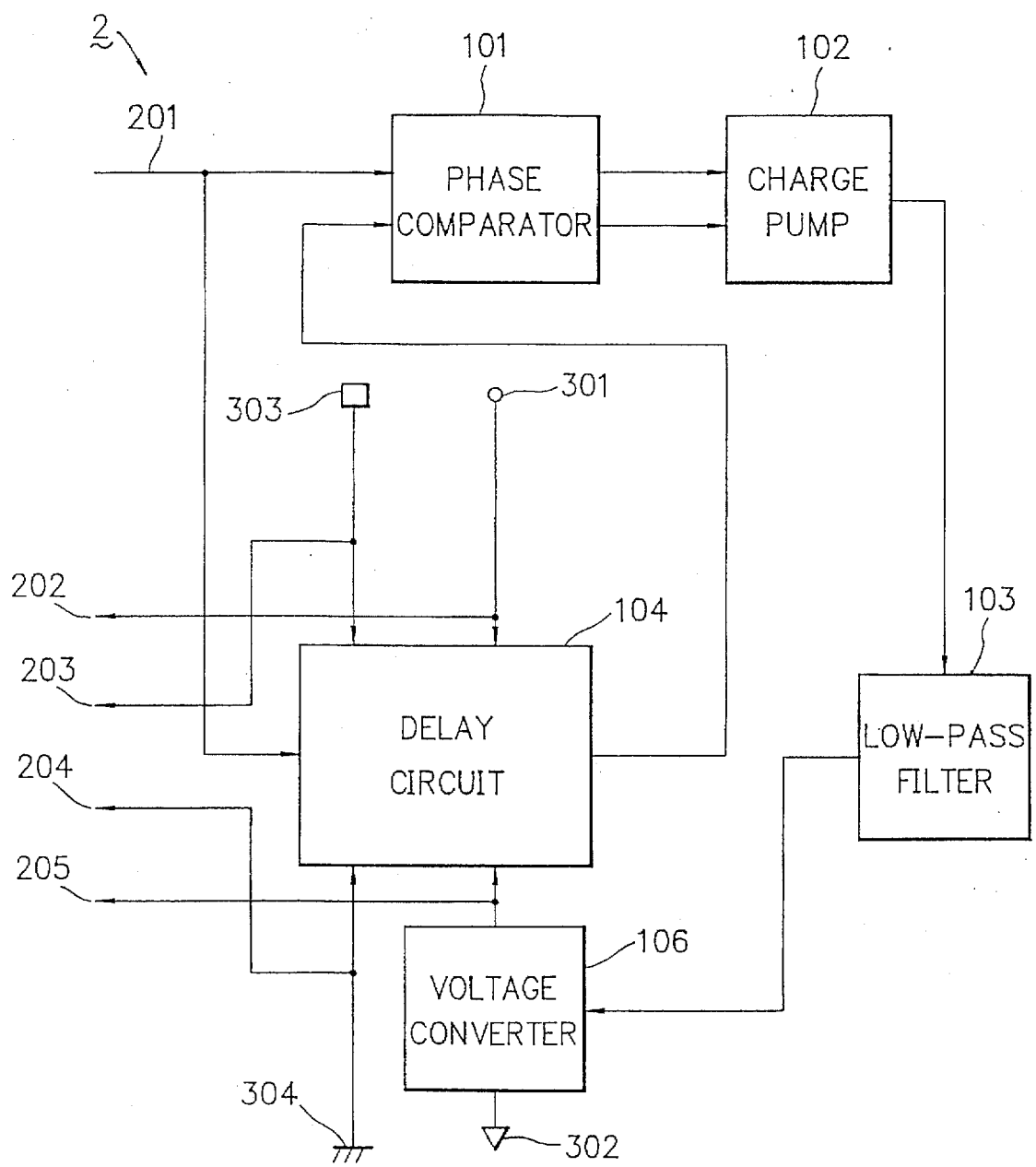
FIG. 3 is a block diagram of a deviation compensation system n a semiconductor integrated circuit according to another embodiment of the invention.

FIG. 3 is a block diagram of a deviation compensation system 2 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process. Such the transistors are voluntarily selected to be employed as pMOS and nMOS transistors in the deviation compensation system 2.

As shown in FIG. 3, the deviation compensation system 2 includes a delay circuit 104 receiving a clock signal obtained from a clock signal line 201, as an input thereto, for giving it a certain delay to output a delayed clock signal, and a phase comparator 101 for outputting a signal depending on a difference between a phase of the signal obtained from the clock signal line 201 and a phase of the output signal of the delay circuit 104.

The compensation system 2 further includes a charge pump circuit 102 receiving the output signal of the phase comparator 101, as an input thereto, a low-pass filter 103 receiving an output signal of the charge pump circuit 102, as an input thereto, and a second voltage converter 106 for generating an output voltage, as a potential difference varying relative to a second power source 302 in dependence on an increasing or decreasing variation of an output signal of the low-pass filter 103, to supply the same to a second internal power supply line 205.

The system 2 still further includes a first subsidiary power supply line 203 connected to a third power source 303, and a second subsidiary power supply line 204 connected to a fourth power source 304.

The delay circuit 104 comprises a plurality of basic gate circuits, whereto the clock signal from the clock signal line 201 is input. The basic gate circuits are operable with a power supply voltage corresponding to a potential difference between a voltage of a first power source 301 and the output voltage of the second voltage converter 106. Each gate circuit is composed of a pMOS transistor having the potential of the third power source 303 as a substrate potential thereof and an nMOS transistor having the potential of the fourth power source 304 as a substrate potential thereof.

FIG. 11 exemplarily shows a circuit diagram of the phase comparator 101 in the system 2.

FIG. 12 exemplarily shows a circuit diagram of the charge pump circuit 102 in the system 2.

FIG. 13 exemplarily shows a circuit diagram of the low-pass filter 103 in the system 2.

FIG. 14 exemplarily shows a circuit diagram of the delay circuit 104 in the system 2.

The delay circuit 104 of FIG. 14 comprises a plurality of cascaded basic gates 104-i as CMOS inverters each composed of a pMOS transistor 104-ia and an nMOS transistor 104-ib.

Each pMOS transistor 104-ia has a substrate voltage thereof supplied from the third power source 303, and each nMOS transistor 104-ib has a substrate voltage thereof supplied from the fourth power source 304.

In the case of system 2, a source electrode of each pMOS transistor 104-ia is connected to the first power source 301; and a source electrode of each nMOS transistor 104-ib, to an output end of the second voltage converter 106.

Figure 16:
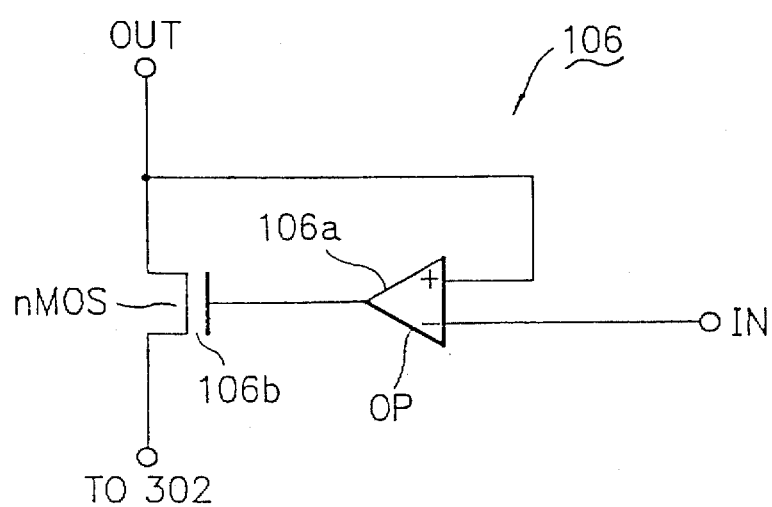
FIG. 16 is a circuit diagram of an example of another voltage converter for use in embodiments of the invention.

FIG. 16 exemplarily shows a circuit diagram of the second voltage converter 106 in the system 2.

The voltage converter 106 of FIG. 16 comprises an operation amplifier 106a and an nMOS transistor 106b operable as a driving amplifier.

The operation amplifier 106a is connected at an inverted (−) input terminal thereof to an input terminal IN of the voltage converter 106, and at a non-inverted (+) input terminal thereof to an output terminal OUT of the converter 106.

The nMOS transistor 106b is connected at a gate electrode thereof to an output terminal of the OP 106a, at a source electrode thereof to the second power source 302 and at a drain electrode thereof to the output terminal OUT of the converter 106, so that an output of the transistor 106b is fed back to the non-inverted input terminal of the OP 106a.

In the system 2 also, as the input terminal IN of the converter 106 is connected to the output terminal of the low-pass filter 103, the converter 106 outputs at the terminal OUT a potential depending on an output potential of the filter 103.

As shown in FIG. 3, in the system 2, a delay time between an input and an output of the delay circuit 104 is controlled to be equivalent to a period of the clock signal input from the clock signal line 201, by a combination of the phase comparator 101, the charge pump circuit 102, the low-pass filter 103 and the second voltage converter 106.

The second internal power supply line 205 has a potential developed thereon by a combination of the second power source 302 and the second voltage converter 106 (See FIG. 16). A first internal power supply line 202 has a potential developed thereon by the first power source 301.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay time between input and output of the delay circuit 104 is controllable by the second voltage converter 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the MOS transistors in the delay circuit 104 so that an action speed of the compensated system is representable by a delay time between input and output of the delay circuit 104.

If the delay time between input and output of the delay circuit 104 is controlled to be equivalent to the period of the clock signal of the clock signal line 201 by the phase comparator 101, the charge pump circuit 102, the low-pass filter 103 and the second voltage converter 106, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the MOS transistors in basic gates of the delay circuit 104, in a manner in which the delay time between input and output of the circuit 104 that represents a delay characteristic of each basic gate is PLL-adjusted to a desirable action speed, thus permitting an effective compensation against the fluctuation tendency.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 3 can be formed by using a double well structure, while permitting an effective deviation compensation of threshold values of pMOS transistors and nMOS transistors to a competent degree to the conventional case.

The semiconductor integrated circuit of FIG. 3 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 3, as the first power source 301 and the second power source 302 are common to the third power source 303 and the fourth power source 304, respectively.

It will be seen that the circuits illustrated in FIGS. 11 to 14 and 16 are mere embodied examples for a facilitated comprehension of the invention.

Figure 4:
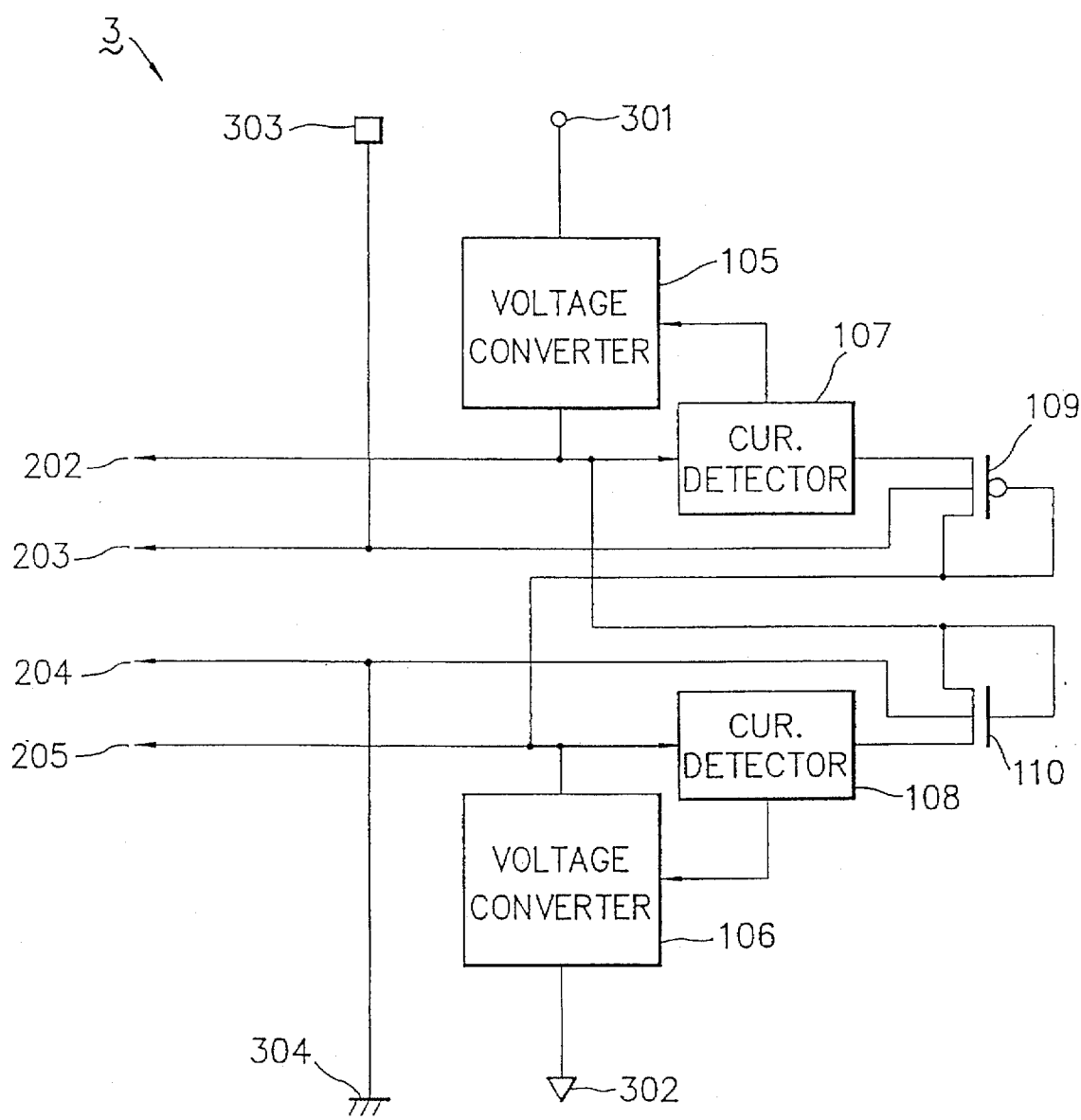
FIG. 4 is a block diagram of a deviation compensation system in a semiconductor integrated circuit according to another embodiment of the invention.

FIG. 4 is a block diagram of a deviation compensation system 3 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process. Such the transistors are voluntarily selected to be employed as pMOS and nMOS transistors in the deviation compensation system 3.

As shown in FIG. 4, the deviation compensation system 3 includes a first power source 301, a second power source 302, a third power source 303, a fourth power source 304, a sample pMOS transistor 109, a sample nMOS transistor 110, a first internal power supply line 202, and a second internal power supply line 205.

The sample pMOS transistor has a substrate electrode thereof connected to the third power source 303 and a drain electrode and a gate electrode thereof connected to the second internal power supply line 205.

The compensation system 3 further includes a first current detection circuit 107 for outputting a signal depending on a current conducted between a source electrode of the sample pMOS transistor 109 and the first internal power supply line 202, and a first voltage converter 105 for generating to output a voltage having a potential difference variable relative to the first power source 301 in dependence on a change of the signal output from the first current detection circuit 107.

The first internal power supply line 202 is supplied with the output voltage of the first voltage converter 105.

The sample nMOS transistor 110 has a substrate electrode thereof connected to the fourth power source 304 and a drain electrode and a gate electrode thereof connected to the first internal power supply line 202.

The system 3 still further includes a second current detection circuit 108 for outputting a signal depending on a current conducted between a source electrode of the sample nMOS transistor 110 and the second internal power supply line 205, and a second voltage converter 106 for generating to output a voltage having a potential difference variable relative to the second power source 302 in dependence on a change of the signal output from the second current detection circuit 108.

The second internal power supply line 205 is supplied with the voltage output from the second voltage converter 106.

The system 3 yet further includes a first subsidiary power supply line 203 connected to the third power source 303, and a second subsidiary power supply line 204 connected to the fourth power source 304.

FIG. 15 exemplarily shows a circuit diagram of the first voltage converter 105 in the system 3. The first voltage converter 105 receives at an input terminal IN thereof an output signal of the first current detection circuit 107.

FIG. 16 exemplarily shows a circuit diagram of the second voltage converter 106 in the system 3. The second voltage converter 106 receives at an input terminal IN thereof an output signal of the second current detection circuit 108.

Figure 17:
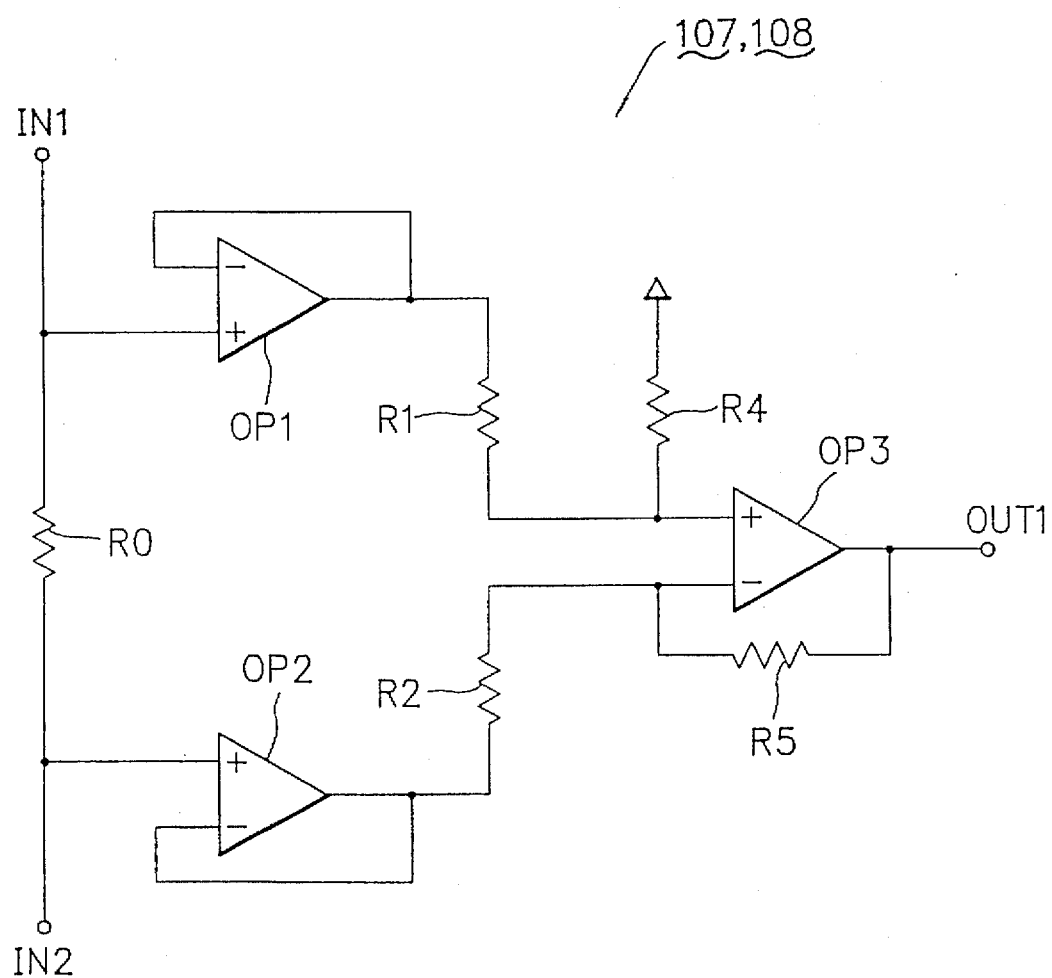
FIG. 17 is a circuit diagram of an example of a current detector for use in embodiments of the invention.

FIG. 17 shows a circuit diagram of an example of the current detection circuits 107 and 108 in the system 3.

Assuming the circuit of FIG. 17 is the first current detection circuit 107, the output voltage of the first voltage converter 105 is input to an input terminal IN1 of the circuit 107 and the source electrode of the sample pMOS transistor 109 is connected to another input terminal IN2 of the circuit 107. The input terminals IN1 and IN2 are interconnected with each other via a resistor R0.

Moreover, the input terminal IN1 connects via a voltage-follower operation amplifier OP1 and a resistor R1 to a non-inverted input terminal of an operation amplifier OP3. The other input terminal IN2 connects via another voltage-follower operation amplifier OP2 and a resistor R2 to an inverted input terminal of the operation amplifier OP3. An output terminal of this amplifier OP3 is connected to via a resistor R5 to the inverted terminal of the amplifier OP3, and directly to an output terminal OUT1 of the current detector 107, which terminal OUT1 connects to an input terminal of the first voltage converter 105. The non-inverted terminal of the amplifier OP3 is connected via a resistor R4 to a ground terminal. If the resistors R1 and R2 have an identical resistance (R1=R2=Rs) and the resistors R4 and R5 have an identical resistance (R4=R5=Rf), the operation amplifier OP3 outputs a voltage equivalent to a potential difference (=I×R0; letting I be a current conducted by the resistor R0) between output voltages of the operation amplifiers OP1 and OP2, as the potential difference is multiplied by a gain (=Rf/Rs), so that the current I is detectable.

The compensation system 3 is controlled by the first and second current detection circuits 107 and 108 and the first and second voltage converters 105 and 106 so that the sample pMOS transistor 109 and the sample nMOS transistor 110 conduct desirable currents in their on-states.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the on-state currents of the sample pMOS and sample nMOS transistors are controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the MOS transistors in the delay circuit 104 so that action speeds of the compensated system is representable by on-state currents of the sample pMOS and sample nMOS transistors 109 and 110.

If the on-state currents of the sample pMOS and sample nMOS transistors 109 and 110 are controlled to be desirable by the first and second current detection circuits 107 and 108 and the first and second voltage converters 105 and 106, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potentials of such MOS transistors are controlled, like the sample MOS transistors, in a manner in which the on-state currents of the sample MOS transistors 109 and 110 that represent characteristics of pMOS and nMOS transistors in the system are controlled as desired, thus permitting an effective compensation against the fluctuation tendency.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 4 can be formed by using a double well structure, while permitting an effective deviation compensation of threshold values of pMOS transistors and nMOS transistors to a competent degree to the conventional case.

The semiconductor integrated circuit of FIG. 4 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 4, as the first power source 301 and the second power source 302 are common to the third power source 303 and the fourth power source 304, respectively.

It will be seen that the circuits illustrated in FIGS. 15 to 17 are mere embodied examples for a facilitated comprehension of the invention.

FIG. 5 is a block diagram of a deviation compensation system 4 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process. Such the transistors are voluntarily selected to be employed as pMOS and nMOS transistors in the deviation compensation system 4.

As shown in FIG. 5, the deviation compensation system 4 includes a first power source 301, a second power source 302, a third power source 303, a fourth power source 304, a clock signal line 201, a delay circuit 104, a charge pump 102, a low-pass filter 103, a first voltage converter 105, and a second voltage converter 106.

The delay circuit 104 is composed of a plurality of basic gates each consisting of a pMOS transistor having a voltage of the third power source 303 as a substrate voltage thereof and an nMOS transistor having a voltage of the fourth power source 304 as a substrate voltage thereof.

The delay circuit 104 receives a signal obtained from the clock signal line 201, as an input signal thereto, and is operated with a power supply voltage equivalent to a potential difference between an output voltage of the first voltage converter 105 and an output voltage of the second voltage converter 106 so that the input signal to the delay circuit 104 is delayed by a certain time to be output therefrom.

The phase comparator 101 outputs a signal depending on a difference between a phase of the signal obtained from the clock signal line 201 and a phase of the signal output from the delay circuit 104.

The charge pump circuit 102 receives the signal output from the phase comparator 101, as an input thereto.

The low-pass filter 103 receives a signal output from the charge pump circuit 102, as an input thereto.

The second voltage converter 106 generates the output voltage thereof having a potential difference variable relative to a voltage of the second power source 302 in dependence on a change of a signal output from the low-pass filter 103.

The compensation system 4 further includes a sample pMOS transistor 109, a first current detection circuit 107, a first internal power supply line 202 supplied with the output voltage of the first voltage converter 105, a second internal power supply line 205 supplied with the output voltage of the second voltage converter 106, a first subsidiary power supply line 203 connected to the third power source 303, and a second subsidiary power supply line 204 connected to the fourth power source 304.

The sample pMOS transistor 109 has a substrate electrode thereof connected to the third power source 303 and a drain electrode and a gate electrode thereof connected to the second internal power supply line 205.

The first current detection circuit 107 outputs a signal depending on a current conducted between a source electrode of the sample pMOS transistor 109 and the first internal power supply line 202.

The first voltage converter 105 generates the output voltage thereof having a potential difference variable relative to a voltage of the first power source 301 in dependence on a change of the signal output from the first current detection circuit 107.

FIG. 11 exemplarily shows a circuit diagram of the phase comparator 101 in the system 4.

FIG. 12 exemplarily shows a circuit diagram of the charge pump circuit 102 in the system 4.

FIG. 13 exemplarily shows a circuit diagram of the low-pass filter 103 in the system 4.

FIG. 14 exemplarily shows a circuit diagram of the delay circuit 104 in the system 4.

The delay circuit 104 of FIG. 14 comprises a plurality of cascaded basic gates 104-$i$ as CMOS inverters each composed of a pMOS transistor 104-$ia$ and an nMOS transistor 104-$ib$.

Each pMOS transistor 104-$ia$ has a substrate voltage thereof supplied from the third power source 303, and each nMOS transistor 104-*ib* has a substrate voltage thereof supplied from the fourth power source 304.

In the case of system 4, a source electrode of each pMOS transistor 104-*ia* is supplied with a potential of the first internal power supply line 202, and a source electrode of each nMOS transistor 104-*ib* is supplied with a potential of the second internal power supply line 205.

FIG. 15 exemplarily shows a circuit diagram of the first voltage converter 105 in the system 4. The first voltage converter 105 receives at an input terminal IN thereof an output signal of the first current detection circuit 107.

FIG. 16 exemplarily shows a circuit diagram of the second voltage converter 106 in the system 4. The second voltage converter 106 receives at an input terminal IN thereof an output signal of the low-pass filter 103.

FIG. 17 exemplarily shows a circuit diagram of the first current detection circuit 107 in the system 4.

As shown in FIG. 5, in the system 4, a delay time between an input and an output of the delay circuit 104 is controlled to be equivalent to a period of the clock signal input from the clock signal line 201, by a combination of the phase comparator 101, the charge pump circuit 102, the low-pass filter 103 and the second voltage converter 106.

Moreover, an on-state current of the sample pMOS transistor 109 is controlled to a desirable value by a combination of the first current detection circuit 107 and the first voltage converter 105.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay time between input and output of the delay circuit 104 as well as the on-state current of the sample pMOS transistor 109 is controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the MOS transistors in the delay circuit 104 and of the sample circuit 109 so that action speeds of pMOS and nMOS transistors of the compensated system are representable by a delay time between input and output of the delay circuit 104 and an on-state current of the sample pMOS transistor 109.

If the delay time between input and output of the delay circuit 104 is controlled to be equivalent to the period of the clock signal of the clock signal line 201 by the phase comparator 101, the charge pump circuit 102, the low-pass filter 103 and the second voltage converter 106, and if the on-state current of the pMOS transistor 109 is controlled as desirable by the first current detection circuit 107 and the first voltage converter 105, then it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potentials of such MOS transistors are controlled, like the MOS transistors in basic gates of the delay circuit 104 and of the sample circuit 109, in a manner in which the delay time between input and output of the circuit 104 and the on-state current of the sample pMOS transistor 109 that represent action characteristics of each basic gate and MOS transistor are each adjusted to a desirable action speed, thus permitting an effective compensation against the fluctuation tendency.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 5 can be formed by using a double well structure, while permitting an effective deviation compensation of threshold values of pMOS transistors and nMOS transistors to a competent degree to the conventional case.

The semiconductor integrated circuit of FIG. 5 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 5, as the first power source 301 and the second power source 302 are common to the third power source 303 and the fourth power source 304, respectively.

It will be seen that the circuits illustrated in FIGS. 11 to 17 are mere embodied examples for a facilitated comprehension of the invention.

Figure 6:
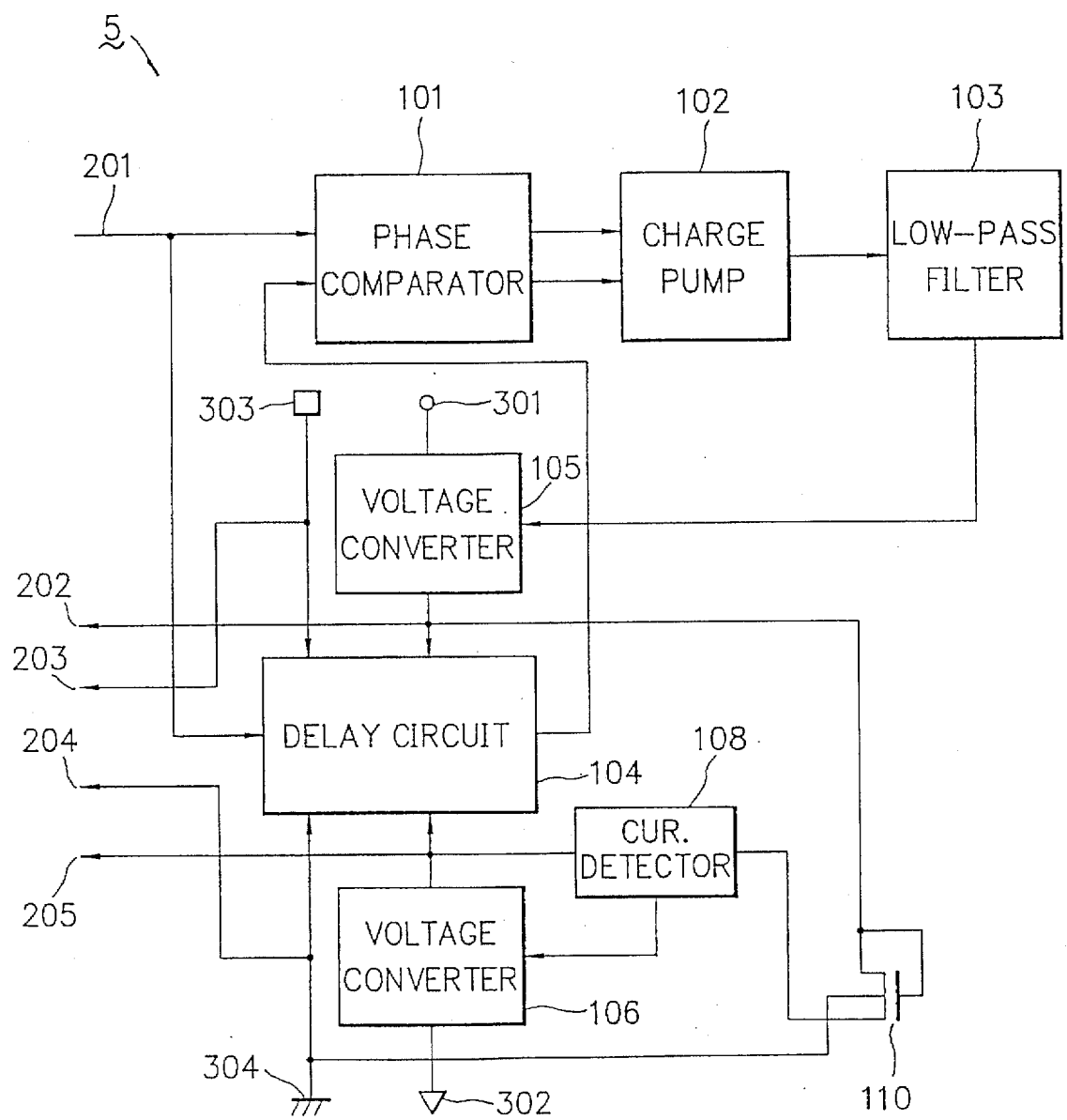
FIG. 6 is a block diagram of a deviation compensation system in a semiconductor integrated circuit according to another embodiment of the invention.

FIG. 6 is a block diagram of a deviation compensation system 5 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process. Such the transistors are voluntarily selected to be employed as pMOS and nMOS transistors in the deviation compensation system 5.

As shown in FIG. 6, the deviation compensation system 5 includes a first power source 301, a second power source 302, a third power source 303, a fourth power source 304, a clock signal line 201, a delay circuit 104, a charge pump 102, a low-pass filter 103, a first voltage converter 105, and a second voltage converter 106.

The delay circuit 104 is composed of a plurality of basic gates each consisting of a pMOS transistor having a voltage of the third power source 303 as a substrate voltage thereof and an nMOS transistor having a voltage of the fourth power source 304 as a substrate voltage thereof.

The delay circuit 104 receives a signal obtained from the clock signal line 201, as an input signal thereto, and is operated with a power supply voltage equivalent to a potential difference between an output voltage of the first voltage converter 105 and an output voltage of the second voltage converter 106 so that the input signal to the delay circuit 104 is delayed by a certain time to be output therefrom.

The phase comparator 101 outputs a signal depending on a difference between a phase of the signal obtained from the clock signal line 201 and a phase of the signal output from the delay circuit 104.

The charge pump circuit 102 receives the signal output from the phase comparator 101, as an input thereto.

The low-pass filter 103 receives a signal output from the charge pump circuit 102, as an input thereto.

The first voltage converter 105 generates the output voltage thereof having a potential difference variable relative to a voltage of the first power source 301 in dependence on a change of a signal output from the low-pass filter 103.

The compensation system 4 further includes a sample nMOS transistor 110, a second current detection circuit 108, a first internal power supply line 202 supplied with the output voltage of the first voltage converter 105, a second internal power supply line 205 supplied with the output voltage of the second voltage converter 106, a first subsidiary power supply line 203 connected to the third power source 303, and a second subsidiary power supply line 204 connected to the fourth power source 304.

The sample nMOS transistor 110 has a substrate electrode thereof connected to the fourth power source 304 and a drain electrode and a gate electrode thereof connected to the first internal power supply line 202.

The second current detection circuit 108 outputs a signal depending on a current conducted between a source electrode of the sample nMOS transistor 110 and the second internal power supply line 205.

The second voltage converter 106 generates the output voltage thereof having a potential difference variable relative to a voltage of the second power source 302 in dependence on a change of the signal output from the second current detection circuit 108.

FIG. 11 exemplarily shows a circuit diagram of the phase comparator 101 in the system 5.

FIG. 12 exemplarily shows a circuit diagram of the charge pump circuit 102 in the system 5.

FIG. 13 exemplarily shows a circuit diagram of the low-pass filter 103 in the system 5.

FIG. 14 exemplarily shows a circuit diagram of the delay circuit 104 in the system 5.

The delay circuit 104 of FIG. 14 comprises a plurality of cascaded basic gates 104-$i$ as CMOS inverters each composed of a pMOS transistor 104-$ia$ and an nMOS transistor 104-$ib$.

Each pMOS transistor 104-$ia$ has a substrate voltage thereof supplied from the third power source 303, and each nMOS transistor 104-$ib$ has a substrate voltage thereof supplied from the fourth power source 304.

In the case of system 5, a source electrode of each pMOS transistor 104-$ia$ is supplied with a potential of the first internal power supply line 202, and a source electrode of each nMOS transistor 104-$ib$ is supplied with a potential of the second internal power supply line 205.

FIG. 15 exemplarily shows a circuit diagram of the first voltage converter 105 in the system 5. The first voltage converter 105 receives at an input terminal IN thereof an output signal of the low-pass filter 103.

FIG. 16 exemplarily shows a circuit diagram of the second voltage converter 106 in the system 5. The second voltage converter 106 receives at an input terminal IN thereof an output signal of the second current detection circuit 108.

FIG. 17 exemplarily shows a circuit diagram of the second current detection circuit 108 in the system 5.

As shown in FIG. 6, in the system 5, a delay time between an input and an output of the delay circuit 104 is controlled to be equivalent to a period of the clock signal input from the clock signal line 201, by a combination of the phase comparator 101, the charge pump circuit 102, the low-pass filter 103 and the first voltage converter 105.

Moreover, an on-state current of the sample nMOS transistor 110 is controlled to a desirable value by a combination of the second current detection circuit 108 and the second voltage converter 106.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay time between input and output of the delay circuit 104 as well as the on-state current of the sample nMOS transistor 110 is controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the MOS transistors in the delay circuit 104 and of the sample circuit 110 so that action speeds of pMOS and nMOS transistors of the compensated system are representable by a delay time between input and output of the delay circuit 104 and an on-state current of the sample nMOS transistor 110.

If the delay time between input and output of the delay circuit 104 is controlled to be equivalent to the period of the clock signal of the clock signal line 201 by the phase comparator 101, the charge pump circuit 102, the low-pass filter 103 and the first voltage converter 105, and if the on-state current of the nMOS transistor 110 is controlled as desirable by the second current detection circuit 108 and the second voltage converter 106, then it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potentials of such MOS transistors are controlled, like the MOS transistors in basic gates of the delay circuit 104 and of the sample circuit 110, in a manner in which the delay time between input and output of the circuit 104 and the on-state current of the sample nMOS transistor 110 that represent action characteristics of each basic gate and MOS transistor are each adjusted to a desirable action speed, thus permitting an effective compensation against the fluctuation tendency.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 6 can be formed by using a double well structure, while permitting an effective deviation compensation of threshold values of pMOS transistors and nMOS transistors to a competent degree to the conventional case.

The semiconductor integrated circuit of FIG. 6 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 6, as the first power source 301 and the second power source 302 are common to the third power source 303 and the fourth power source 304, respectively.

It will be seen that the circuits illustrated in FIGS. 11 to 17 are mere embodied examples for a facilitated comprehension of the invention.

Figure 7:
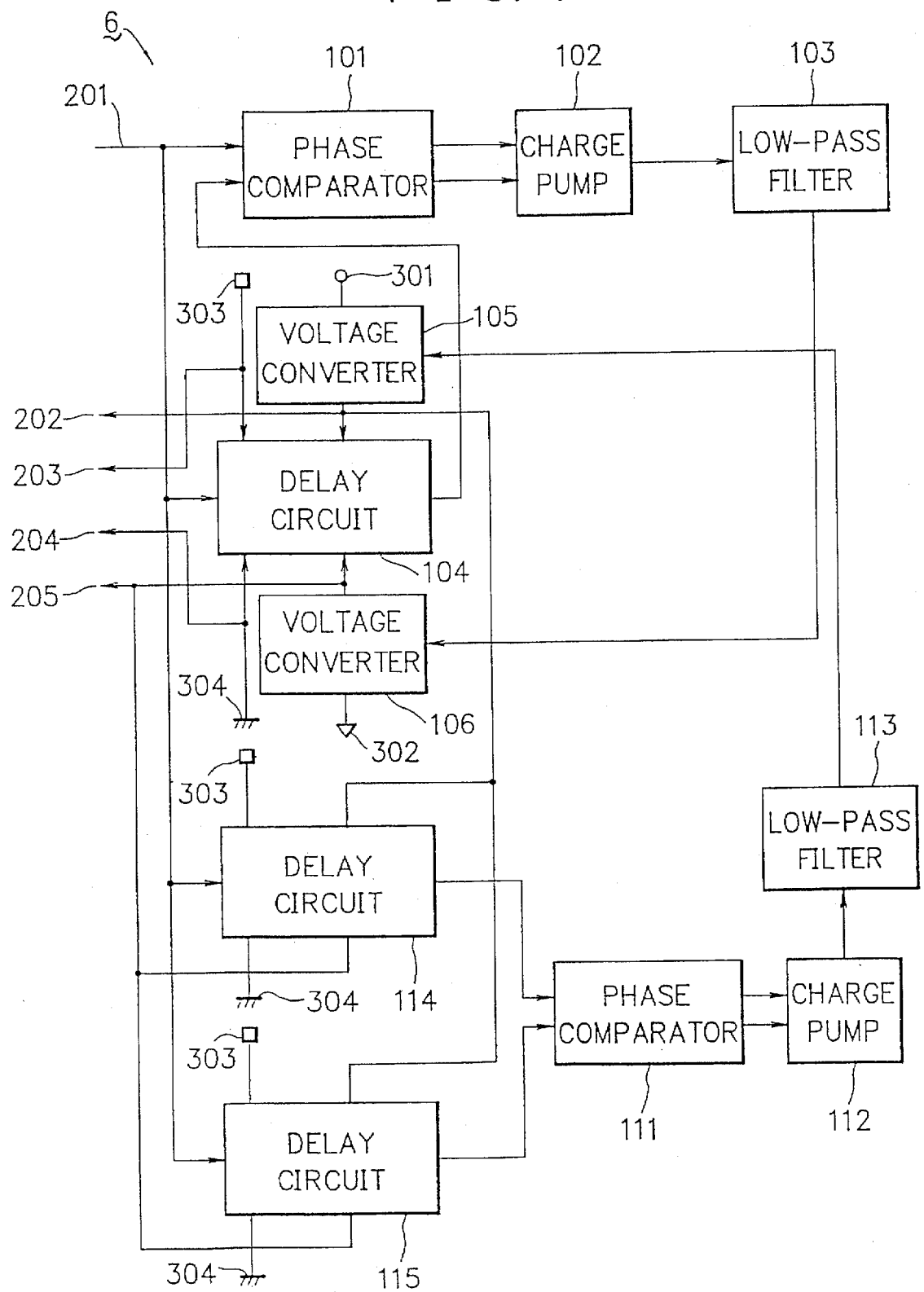
FIG. 7 is a block diagram of a deviation compensation system in a semiconductor integrated circuit according to another embodiment of the invention.

FIG. 7 is a block diagram of a deviation compensation system 6 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process (except for later-described second pMOS and third nMOS transistors). Such the transistors are voluntarily selected to be employed as pMOS and nMOS transistors in the deviation compensation system 6.

As shown in FIG. 7, the deviation compensation system 6 includes a first power source 301, a second power source 302, a third power source 303, a fourth power source 304, a first delay circuit 104, a first phase comparator 101, a first charge pump circuit 102, a first low-pass filter 103, a first voltage converter 301, a second voltage converter 302, a first internal power supply line 202 supplied with an output voltage of the first voltage converter 301, a second internal power supply line 205 supplied with an output voltage of the second voltage converter 302, a first subsidiary power supply line 203 connected to the third power source 303, and a second subsidiary power supply line 204 connected to the fourth power source 304.

The first delay circuit 104 is composed of a plurality of basic gates each consisting of a pMOS transistor (hereafter sometimes "first pMOS transistor") having a voltage of the third power source 303 as a substrate voltage thereof and an nMOS transistor (hereafter sometimes "first nMOS transistor") having a voltage of the fourth power source 304 as a substrate voltage thereof.

The first delay circuit 104 receives a clock signal obtained from a clock signal line 201, as an input signal thereto, and being operated with a power supply voltage substantially equivalent to a potential difference between an output voltage of the first voltage converter 105 and an output voltage of the second voltage converter 106 so that the input signal to the first delay circuit 104 is delayed by a certain time to be output therefrom.

The first phase comparator 101 outputs a signal depending on a difference between a phase of the signal obtained from the clock signal line 201 and a phase of the signal output from the first delay circuit 104.

The first charge pump circuit 102 receives the signal output from the first phase comparator 101, as an input thereto. The first low-pass filter 103 receives a signal output from the first charge pump circuit 102, as an input thereto.

The second voltage converter 106 generates the output voltage thereof having a potential difference variable relative to the second power source 302 in dependence on a change of a signal output from the first low-pass filter 103.

The compensation system 6 further includes a second delay circuit 114, a third delay circuit 115, a second phase comparatpor 111, a second charge pump circuit 112, and a second law-pass filter 113.

The second delay circuit 114 is composed of a plurality of basic gates each consisting of a pMOS transistor (hereafter sometimes "second pMOS transistor") having the voltage of the third power source 303 as a substrate voltage thereof and an nMOS transistor (hereafter sometimes "second nMOS transistor") having the voltage of the fourth power source 304 as a substrate voltage thereof.

The second pMOS transistor has a sufficiently larger gate width than the second nMOS transistor.

The second delay circuit 114 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the second delay circuit 114 is delayed by a certain time to be output therefrom.

The third delay circuit 115 is composed of a plurality of basic gates each consisting of a pMOS transistor (hereafter sometimes "third pMOS transistor") having the voltage of the third power source 303 as a substrate voltage thereof and an nMOS transistor (hereafter sometimes "third nMOS transistor") having the voltage of the fourth power source 304 as a substrate voltage thereof.

The third nMOS transistor has a sufficiently larger gate width than the third pMOS transistor.

The third delay circuit 115 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the third delay circuit 115 is delayed by a certain time to be output therefrom.

The second phase comparator 111 outputs a signal depending on a difference between a phase of the signal output from the second delay circuit 114 and a phase of the signal output from the third delay circuit 115.

The second charge pump circuit 112 receives the signal output from the second phase comparator 111, as an input thereto, and the second low-pass filter 113 receives a signal output from the second charge pump circuit 112, as an input thereto.

The first voltage converter 105 generates the output voltage thereof having a potential difference variable relative to the first power source 301 in dependence on a change of a signal output from the second low-pass filter 113.

FIG. 11 shows a circuit diagram of an example of the phase comparators 101 and 111 in the system 6.

FIG. 12 shows a circuit diagram of an example of the charge pump circuits 102 and 112 in the system 6.

FIG. 13 shows a circuit diagram of an example of the low-pass filters 103 and 113 in the system 6.

FIG. 14 shows a circuit diagram of an example of the delay circuits 104, 114 and 115 in the system 6.

Each first pMOS transistor 104-$ia$ as well as the second and third pMOS transistors has a substrate voltage thereof supplied from the third power source 303, and each first nMOS transistor 104-$ib$ as well as the second and third nMOS transistors has a substrate voltage thereof supplied from the fourth power source 304.

In the case of system 6, a source electrode of each pMOS transistor is supplied with a potential of the first internal power supply line 202, and a source electrode of each nMOS transistor is supplied with a potential of the second internal power supply line 205.

FIG. 15 exemplarily shows a circuit diagram of the first voltage converter 105 in the system 6. The first voltage converter 105 receives at an input terminal IN thereof an output signal of the second low-pass filter 113.

FIG. 16 exemplarily shows a circuit diagram of the second voltage converter 106 in the system 6. The second voltage converter 106 receives at an input terminal IN thereof an output signal of the first low-pass filter 103.

As shown in FIG. 7, in the system 6, a delay time between input and output of the first delay circuit 104 is controlled to be equivalent to a period of the clock signal input from the clock signal line 201, by a first PLL constituted with the first phase comparator 101, the first charge pump circuit 102, the first low-pass filter 103, the second voltage converter 106 and the first delay circuit 104.

Moreovoer, a delay time between input and output of the second delay circuit 114 and a delay time between input and output of the third delay circuit 115 are controlled for a match therebetween, by a second PLL constituted with the second phase comparator 111, the second charge pump circuit 112, the second low-pass filter 113, the first voltage converter 105, the second delay circuit 114 and the third delay circuit 115.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay times between inputs and outputs of the first, second and third delay circuits 104, 114 and 115 are controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the first pMOS and first nMOS transistors in the first delay circuit 104, the second nMOS transistors in the second delay circuit 114 and the third pMOS transistors in the third delay circuit 115. Accordingly, an action speed of the compensated system is represented by a delay time between input and output of the first delay circuit 104.

The gate width of each second pMOS transistor is sufficiently larger than that of arbitrary nMOS transistor in the compensated system to represent an action speed of the latter. Likewise, the gate width of each third nMOS transistor is sufficiently larger than that of arbitrary pMOS transistor in the compensated system to represent an action speed of the latter.

If the second voltage converter 106 is controlled by the first phase comparator 101, the first charge pump circuit 102 and the first low-pass filter 103 so that the delay time between input and output of the first delay circuit 104 is identical to the period of the clock signal input from the clock signal line 201, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the first pMOS and first nMOS transistors in basic gates of the first delay circuit 104, in a manner in which the delay time between input and output of the first delay circuit 104 that represents a delay characteristic of each basic gate is adjusted to a desirable action speed, thus permitting an effective compensation against the fluctuation tendency.

Moreover, when the first voltage converter 105 is controlled by the second phase comparator 111, the second charge pump circuit 112 and the second low-pass filter 113 so that the delay time between input and output of the second delay circuit 114 and the delay time between input and output of the third delay circuit 115 equals each other, respective associated MOS transistors have their substrate potentials controlled such that the second nMOS transistors and the third pMOS transistors have a matching action speed.

In a conventional CMOS circuit, as a saturation current of an nMOS transistor identical in channel length, channel width and fabrication process to a pMOS transistor was about a double of a saturation current of the pMOS transistor, it was necessary for a match between a rise time and a fall time of signals to provide the pMOS transistor with a channel width substantially equivalent to a double of a channel width of the nMOS transistor.

However, in the semiconductor integrated circuit according to the present embodiment, there is achieved a match between a rise time and a fall time of signals, not by an optimization of channel width for a match between saturation currents of nMOS and pMOS transistors, but by controlling substrate potentials of the transistors for a match between their threshold values. Therefore, an associated increase in channel width of pMOS transistor will not cause an undue increase in load capacity.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 7 can be formed by using a double well structure, while permitting an effective deviation compensation of threshold values of pMOS transistors and nMOS transistors to a competent degree to the conventional case.

The semiconductor integrated circuit of FIG. 7 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 7, as the first power source 301 and the second power source 302 are common to the third power source 303 and the fourth power source 304, respectively.

It will be seen that the circuits illustrated in FIGS. 11 to 16 are mere embodied examples for a facilitated comprehension of the invention.

Figure 8:
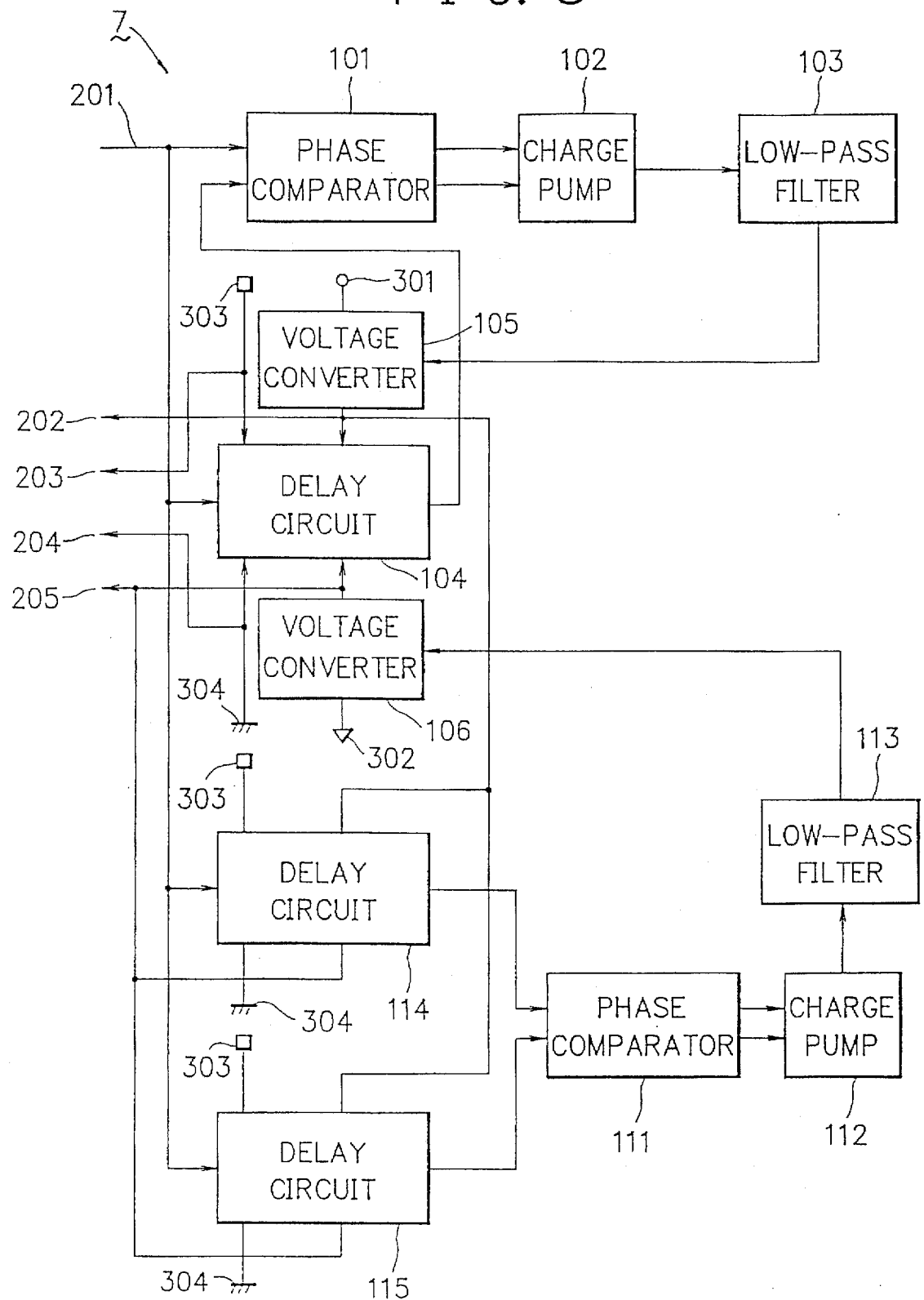
FIG. 8 is a block diagram of a deviation compensation system in a semiconductor integrated circuit according to another embodiment of the invention.

FIG. 8 is a block diagram of a deviation compensation system 7 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process (except for later-described second pMOS and third nMOS transistors). Such the transistors are voluntarily selected to be employed as pMOS and nMOS transistors in the deviation compensation system 7.

As shown in FIG. 8, the deviation compensation system 7 includes a first power source 301, a second power source 302, a third power source 303, a fourth power source 304, a first delay circuit 104, a first phase comparator 101, a first charge pump circuit 102, a first low-pass filter 103, a first voltage converter 301, a second voltage converter 302, a first internal power supply line 202 supplied with an output voltage of the first voltage converter 301, a second internal power supply line 205 supplied with an output voltage of the second voltage converter 302, a first subsidiary power supply line 203 connected to the third power source 303, and a second subsidiary power supply line 204 connected to the fourth power source 304.

The first delay circuit 104 is composed of a plurality of basic gates each consisting of a pMOS transistor (hereafter sometimes "first pMOS transistor") having a voltage of the third power source 303 as a substrate voltage thereof and an nMOS transistor (hereafter sometimes "first nMOS transistor") having a voltage of the fourth power source 304 as a substrate voltage thereof.

The first delay circuit 104 receives a clock signal obtained from a clock signal line 201, as an input signal thereto, and being operated with a power supply voltage substantially equivalent to a potential difference between an output voltage of the first voltage converter 105 and an output voltage of the second voltage converter 106 so that the input signal to the first delay circuit 104 is delayed by a certain time to be output therefrom.

The first phase comparator 101 outputs a signal depending on a difference between a phase of the signal obtained from the clock signal line 201 and a phase of the signal output from the first delay circuit 104.

The first charge pump circuit 102 receives the signal output from the first phase comparator 101, as an input thereto. The first low-pass filter 103 receives a signal output from the first charge pump circuit 102, as an input thereto.

The first voltage converter 105 generates the output voltage thereof having a potential difference variable relative to the first power source 301 in dependence on a change of a signal output from the first low-pass filter 103.

The compensation system 7 further includes a second delay circuit 114, a third delay circuit 115, a second phase comparatpor 111, a second charge pump circuit 112, and a second low-pass filter 113.

The second delay circuit 114 is composed of a plurality of basic gates each consisting of a pMOS transistor (hereafter sometimes "second pMOS transistor") having the voltage of the third power source 303 as a substrate voltage thereof and an nMOS transistor (hereafter sometimes "second nMOS transistor") having the voltage of the fourth power source 304 as a substrate voltage thereof.

The second pMOS transistor has a sufficiently larger gate width than the second nMOS transistor.

The second delay circuit 114 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the second delay circuit 114 is delayed by a certain time to be output therefrom.

The third delay circuit 115 is composed of a plurality of basic gates each consisting of a pMOS transistor (hereafter sometimes "third pMOS transistor") having the voltage of the third power source 303 as a substrate voltage thereof and an nMOS transistor (hereafter sometimes "third nMOS transistor") having the voltage of the fourth power source 304 as a substrate voltage thereof.

The third nMOS transistor has a sufficiently larger gate width than the third pMOS transistor.

The third delay circuit 115 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the third delay circuit 115 is delayed by a certain time to be output therefrom.

The second phase comparator 111 outputs a signal depending on a difference between a phase of the signal output from the second delay circuit 114 and a phase of the signal output from the third delay circuit 115.

The second charge pump circuit 112 receives the signal output from the second phase comparator 111, as an input thereto, and the second low-pass filter 113 receives a signal output from the second charge pump circuit 112, as an input thereto.

The second voltage converter 106 generates the output voltage thereof having a potential difference variable relative to the second power source 302 in dependence on a change of a signal output from the second low-pass filter 113.

FIG. 11 shows a circuit diagram of an example of the phase comparators 101 and 111 in the system 7.

FIG. 12 shows a circuit diagram of an example of the charge pump circuits 102 and 112 in the system 7.

FIG. 13 shows a circuit diagram of an example of the low-pass filters 103 and 113 in the system 7.

FIG. 14 shows a circuit diagram of an example of the delay circuits 104, 114 and 115 in the system 7.

Each first pMOS transistor 104-*ia* as well as the second and third pMOS transistors has a substrate voltage thereof supplied from the third power source 303, and each first nMOS transistor 104-*ib* as well as the second and third nMOS transistors has a substrate voltage thereof supplied from the fourth power source 304.

In the case of system 7, a source electrode of each pMOS transistor is supplied with a potential of the first internal power supply line 202, and a source electrode of each nMOS transistor is supplied with a potential of the second internal power supply line 205.

FIG. 15 exemplarily shows a circuit diagram of the first voltage converter 105 in the system 7. The first voltage converter 105 receives at an input terminal IN thereof an output signal of the first low-pass filter 103.

FIG. 16 exemplarily shows a circuit diagram of the second voltage converter 106 in the system 7. The second voltage converter 106 receives at an input terminal IN thereof an output signal of the second low-pass filter 113.

As shown in FIG. 8, in the system 7, a delay time between input and output of the first delay circuit 104 is controlled to be equivalent to a period of the clock signal input from the clock signal line 201, by a first PLL constituted with the first phase comparator 101, the first charge pump circuit 102, the first low-pass filter 103, the first voltage converter 105 and the first delay circuit 104.

Further, a delay time between input and output of the second delay circuit 114 and a delay time between input and output of the third delay circuit 115 are controlled for a match therebetween, by a second PLL constituted with the second phase comparator 111, the second charge pump circuit 112, the second low-pass filter 113, the second voltage converter 106, the second delay circuit 114 and the third delay circuit 115.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay times between inputs and outputs of the first, second and third delay circuits 104, 114 and 115 are controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the first pMOS and first nMOS transistors in the first delay circuit 104, the second nMOS transistors in the second delay circuit 114 and the third pMOS transistors in the third delay circuit 115. Accordingly, an action speed of the compensated system is represented by a delay time between input and output of the first delay circuit 104.

The gate width of each second pMOS transistor is sufficiently larger than that of arbitrary nMOS transistor in the compensated system to represent an action speed of the latter. Likewise, the gate width of each third nMOS transistor is sufficiently larger than that of arbitrary pMOS transistor in the compensated system to represent an action speed of the latter.

If the first voltage converter 105 is controlled by the first phase comparator 101, the first charge pump circuit 102 and the first low-pass filter 103 so that the delay time between input and output of the first delay circuit 104 is identical to the period of the clock signal input from the clock signal line 201, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the first pMOS and first nMOS transistors in basic gates of the first delay circuit 104, in a manner in which the delay time between input and output of the first delay circuit 104 that represents a delay characteristic of each basic gate is adjusted to a desirable action speed, thus permitting an effective compensation against the fluctuation tendency.

Moreover, when the second voltage converter 106 is controlled by the second phase comparator 111, the second charge pump circuit 112 and the second low-pass filter 113 so that the delay time between input and output of the second delay circuit 114 and the delay time between input and output of the third delay circuit 115 equals each other, respective associated MOS transistors have their substrate potentials controlled such that the second nMOS transistors and the third pMOS transistors have a matching action speed.

In a conventional CMOS circuit, as a saturation current of an nMOS transistor identical in channel length, channel width and fabrication process to a pMOS transistor was about a double of a saturation current of the pMOS transistor, it was necessary for a match between a rise time and a fall time of signals to provide the pMOS transistor with a channel width substantially equivalent to a double of a channel width of the nMOS transistor.

However, in the semiconductor integrated circuit according to the present embodiment, there is achieved a match between a rise time and a fall time of signals, not by an optimization of channel width for a match between saturation currents of nMOS and pMOS transistors, but by controlling substrate potentials of the transistors for a match between their threshold values. Therefore, an associated increase in channel width of pMOS transistor will not cause an undue increase in load capacity.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 8 can be formed by using a double well structure, while permitting an effective deviation compensation of threshold values of pMOS transistors and nMOS transistors to a competent degree to the conventional case.

The semiconductor integrated circuit of FIG. 8 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 8, as the first power source 301 and the second power source 302 are common to the third power source 303 and the fourth power source 304, respectively.

It will be seen that the circuits illustrated in FIGS. 11 to 16 are mere embodied examples for a facilitated comprehension of the invention.

Figure 9:
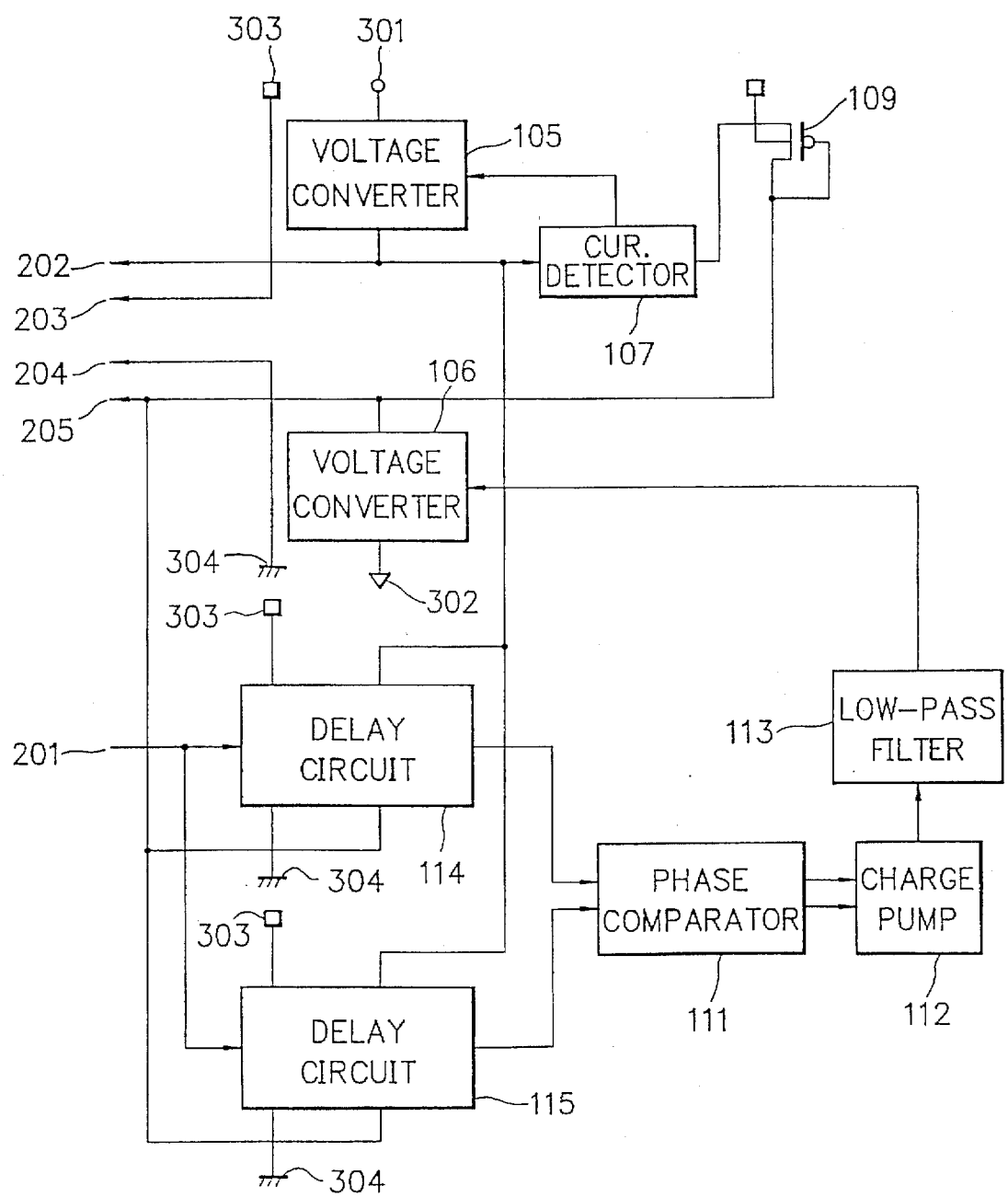
FIG. 9 is a block diagram of a deviation compensation system in a semiconductor integrated circuit according to another embodiment of the invention.

FIG. 9 is a block diagram of a deviation compensation system 8 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process (except for later-described first pMOS and second nMOS transistors). Such the transistors are voluntarily selected to be employed as pMOS and nMOS transistors in the deviation compensation system 8.

As shown in FIG. 9, the deviation compensation system 8 includes a first power source 301, a second power source 302, a third power source 303, a fourth power source 304, a first internal power supply line 202 supplied with an output voltage of a first voltage converter 301, a second internal power supply line 205 supplied with an output voltage of a second voltage converter 106, a sample pMOS transistor 109, and a current detection circuit 107.

The sample pMOS transistor 109 has a substrate electrode thereof connected to the third power source 303 and a drain electrode and a gate electrode thereof connected to the second internal power supply line 202.

The current detection circuit 107 outputs a signal depending on a current conducted between a source electrode of the sample pMOS transistor 109 and the first internal power supply line 202.

The first voltage converter 105 generates the output voltage thereof having a potential difference variable relative to the first power source 301 in dependence on a change of the signal output from the current detection circuit 107.

The compensation system 8 further includes a first delay circuit 114, a second delay circuit 115, a phase comparator 111, a charge pump circuit 112, a low-pass filter 113, a first subsidiary power supply line 203 connected to the third power source 303, and a second subsidiary power supply line 204 connected to the fourth power source 304.

The first delay circuit 114 is composed of a plurality of basic gates each consisting of a pMOS transistor (hereafter sometimes "first pMOS transistor") having a voltage of the third power source 303 as a substrate voltage thereof and an nMOS transistor (hereafter sometimes "first nMOS transistor") having a voltage of the fourth power source 304 as a substrate voltage thereof.

The first pMOS transistor has a sufficiently larger gate width than the first nMOS transistor.

The first delay circuit 114 receives a clock signal obtained from a clock signal line 201, as an input signal thereto, and is operated with a power supply voltage equivalent to a potential difference between the output voltage of the first voltage converter 105 and the output voltage of the second voltage converter 106 so that the input signal to the first delay circuit 114 is delayed by a certain time to be output therefrom.

The second delay circuit 115 is composed of a plurality of basic gates each consisting of a pMOS transistor (hereafter sometimes "second pMOS transistor") having the voltage of the third power source 303 as a substrate voltage thereof and an nMOS transistor (hereafter sometimes "second nMOS transistor") having the voltage of the fourth power source 304 as a substrate voltage thereof.

The second nMOS transistor has a sufficiently larger gate width than the second pMOS transistor.

The second delay circuit 115 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the second delay circuit 115 is delayed by a certain time to be output therefrom.

The phase comparator 111 outputs a signal depending on a difference between a phase of the signal output from the first delay circuit 114 and a phase of the signal output from the second delay circuit 115.

The charge pump circuit 112 receives the signal output from the phase comparator 111, as an input thereto.

The low-pass filter 113 receives a signal output from the charge pump circuit 112, as an input thereto.

The second voltage converter 106 generates the output voltage thereof having a potential difference variable relative to the second power source 302 in dependence on a change of a signal output from the low-pass filter 113.

FIG. 11 shows a circuit diagram of an example of the phase comparator 111 in the system 8.

FIG. 12 shows a circuit diagram of an example of the charge pump circuit 112 in the system 8.

FIG. 13 shows a circuit diagram of an example of the low-pass filter 113 in the system 8.

FIG. 14 shows a circuit diagram of an example of the delay circuits 114 and 115 in the system 8.

Each first pMOS transistor 104-*ia* as well as each second pMOS transistor has a substrate voltage thereof supplied from the third power source 303, and each first nMOS transistor 104-*ib* as well as each second nMOS transistor has a substrate voltage thereof supplied from the fourth power source 304.

In the case of system 8, a source electrode of each pMOS transistor is supplied with a potential of the first internal power supply line 202, and a source electrode of each nMOS transistor is supplied with a potential of the second internal power supply line 205.

FIG. 15 exemplarily shows a circuit diagram of the first voltage converter 105 in the system 8. The first voltage converter 105 receives at an input terminal IN thereof an output signal of the current detection circuit 107.

FIG. 16 exemplarily shows a circuit diagram of the second voltage converter 106 in the system 8. The second voltage converter 106 receives at an input terminal IN thereof an output signal of the low-pass filter 113.

FIG. 17 exemplarily shows a circuit diagram of the current detection circuit 107 in the system 8.

As shown in FIG. 9, in the system 8, a delay time between input and output of the first delay circuit 114 and a delay time between input and output of the second delay circuit 115 are controlled for a match therebetween, by a combination of the phase comparator 111, the charge pump circuit 112, the low-pass filter 113 and the second voltage converter 106.

Further, an on-state current of the sample pMOS transistor 109 is controlled as desirable, by a combination of the current detection circuit 107 and the first voltage converter 105.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay times between inputs and outputs of the first and second delay circuits 114 and 115 as well as the on-state current of the sample pMOS transistor 109 are controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the first nMOS transistors in the first delay circuit 114, the second pMOS transistors in the second delay circuit 115 and the pMOS transistor of the sample circuit 109. Accordingly, an action speed of the compensated system is represented by an on-state current of the sample pMOS transistor 109.

The gate width of each first pMOS transistor is sufficiently larger than that of arbitrary nMOS transistor in the compensated system to represent an action speed of the latter. Likewise, the gate width of each second nMOS transistor is sufficiently larger than that of arbitrary pMOS transistor in the compensated system to represent an action speed of the latter.

If the second voltage converter 106 is controlled by the phase comparator 111, the charge pump circuit 112 and the low-pass filter 113 so that the delay time between input and output of the first delay circuit 114 and the delay time between input and output of the second delay circuit 115 match each other, and if the first voltage converter 105 is controlled by the current detection circuit 107 so that the on-state current of the sample pMOS transistor 109 has a desirable value, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the first nMOS and second pMOS transistors in basic gates of the first and second delay circuits 114 and 115 as well as the sample pMOS transistor 109, in a manner in which the delay times between inputs and outputs of the first and second delay circuits 114 and 115 and the on-state current of the sample pMOS transistor 109 that represent delay characteristics of basic gates are adjusted to desirable action speeds, thus permitting an effective compensation against the fluctuation tendency.

Moreover, when the second voltage converter 106 is controlled by the phase comparator 111, the charge pump circuit 112 and the low-pass filter 113 so that the delay time between input and output of the first delay circuit 114 and the delay time between input and output of the second delay circuit 115 equal each other, respective associated MOS transistors have their substrate potentials controlled such that the first nMOS transistors and the second pMOS transistors have a matching action speed.

In a conventional CMOS circuit, as a saturation current of an nMOS transistor identical in channel length, channel width and fabrication process to a pMOS transistor was about a double of a saturation current of the pMOS transistor, it was necessary for a match between a rise time and a fall time of signals to provide the pMOS transistor with a channel width substantially equivalent to a double of a channel width of the nMOS transistor.

However, in the semiconductor integrated circuit according to the present embodiment, there is achieved a match between a rise time and a fall time of signals, not by an optimization of channel width for a match between saturation currents of nMOS and pMOS transistors, but by controlling substrate potentials of the transistors for a match between their threshold values. Therefore, an associated increase in channel width of pMOS transistor will not cause an undue increase in load capacity.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 9 can be formed by using a double well structure, while permitting an effective deviation compensation of threshold values of pMOS transistors and nMOS transistors to a competent degree to the conventional case.

The semiconductor integrated circuit of FIG. 9 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 9, as the first power source 301 and the second power source 302 are common to the third power source 303 and the fourth power source 304, respectively.

It will be seen that the circuits illustrated in FIGS. 11 to 17 are mere embodied examples for a facilitated comprehension of the invention.

Figure 10:
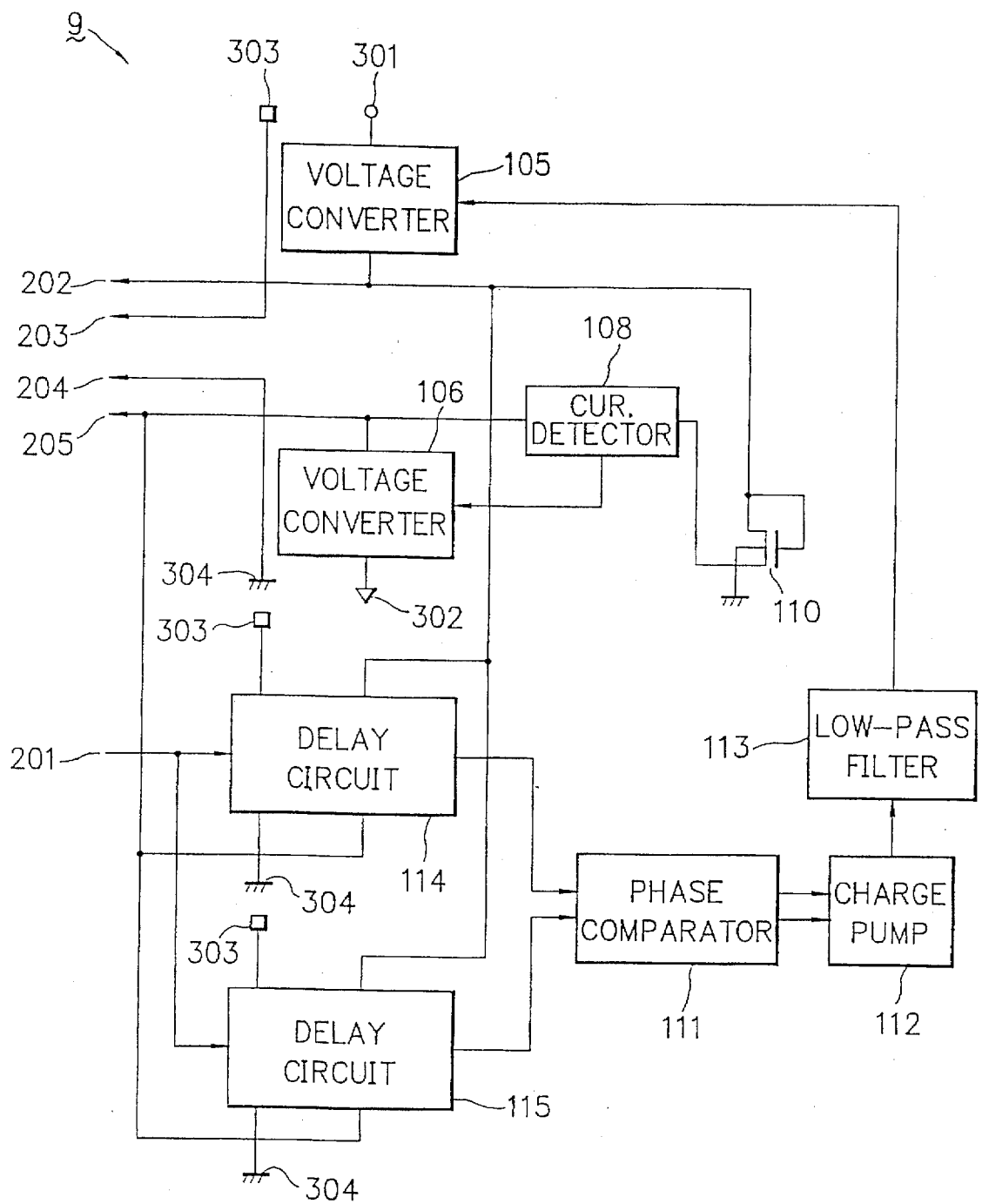
FIG. 10 is a block diagram of a deviation compensation system in a semiconductor integrated circuit according to another embodiment of the invention.

FIG. 10 is a block diagram of a deviation compensation system 9 in a semiconductor integrated circuit formed on a chip according to an embodiment of the invention.

The semiconductor integrated circuit has therein a multiplicity of pMOS transistors concurrently formed in a fabrication process and a multiplicity of nMOS transistors concurrently formed in the fabrication process (except for later-described first pMOS and second nMOS transistors). Such the transistors are voluntarily selected to be employed as pMOS and nMOS transistors in the deviation compensation system 9.

As shown in FIG. 10, the deviation compensation system 9 includes a first power source 301, a second power source 302, a third power source 303, a fourth power source 304, a first internal power supply line 202 supplied with an output voltage of a first voltage converter 301, a second internal power supply line 205 supplied with an output voltage of a second voltage converter 106, a first delay circuit 114, a second delay circuit 115, a phase comparator 111, a charge pump circuit 112, and a low-pass filter 113.

The first delay circuit 114 is composed of a plurality of basic gates each consisting of a pMOS transistor (hereafter sometimes "first pMOS transistor") having a voltage of the third power source 303 as a substrate voltage thereof and an nMOS transistor (hereafter sometimes "first nMOS transistor") having a voltage of the fourth power source 304 as a substrate voltage thereof.

The first pMOS transistor has a sufficiently larger gate width than the first nMOS transistor.

The first delay circuit 114 receives a clock signal obtained from a clock signal line 201, as an input signal thereto, and is operated with a power supply voltage equivalent to a potential difference between the output voltage of the first voltage converter 105 and the output voltage of the second voltage converter 106 so that the input signal to the first delay circuit 114 is delayed by a certain time to be output therefrom.

The second delay circuit 115 is composed of a plurality of basic gates each consisting of a pMOS transistor (hereafter sometimes "second pMOS transistor") having the voltage of the third power source 303 as a substrate voltage thereof and an nMOS transistor (hereafter sometimes "second nMOS transistor") having the voltage of the fourth power source 304 as a substrate voltage thereof.

The second nMOS transistor has a sufficiently larger gate width than the second pMOS transistor.

The second delay circuit 115 receives the clock signal obtained from the clock signal line 201, as an input signal thereto, and is operated with a power supply voltage equivalent to the potential difference between the output voltage of the first voltage converter 105 and the output voltage of the second voltage converter 106 so that the input signal to the second delay circuit 115 is delayed by a certain time to be output therefrom.

The phase comparator 111 outputs a signal depending on a difference between a phase of the signal output from the first delay circuit 114 and a phase of the signal output from the second delay circuit 115.

The charge pump circuit 112 receives the signal output from the phase comparator 111, as an input thereto.

The low-pass filter 113 receives a signal output from the charge pump circuit 112, as an input thereto.

The first voltage converter 105 generates the output voltage thereof having a potential difference variable relative to the first power source 301 in dependence on a change of a signal output from the low-pass filter 113.

The compensation system 9 further includes a sample nMOS transistor 110, a current detection circuit 108, a first subsidiary power supply line 203 connected to the third power source 303, and a second subsidiary power supply line 204 connected to the fourth power source 304.

The sample nMOS transistor 110 has a substrate electrode thereof connected to the third power source 303 and a drain electrode and a gate electrode thereof connected to the second internal power supply line 202.

The first current detection circuit 108 outputs a signal depending on a current conducted between a source electrode of the sample nMOS transistor 110 and the second internal power supply line 205.

The second voltage converter 106 generates the output voltage thereof having a potential difference variable relative to the second power source 302 in dependence on a change of the signal output from the current detection circuit 108.

FIG. 11 shows a circuit diagram of an example of the phase comparator 111 in the system 9.

FIG. 12 shows a circuit diagram of an example of the charge pump circuit 112 in the system 9.

FIG. 13 shows a circuit diagram of an example of the low-pass filter 113 in the system 9.

FIG. 14 shows a circuit diagram of an example of the delay circuits 114 and 115 in the system 9.

Each first pMOS transistor 104-$ia$ as well as each second pMOS transistor has a substrate voltage thereof supplied from the third power source 303, and each first nMOS transistor 104-$ib$ as well as each second nMOS transistor has a substrate voltage thereof supplied from the fourth power source 304.

In the case of system 9, a source electrode of each pMOS transistor is supplied with a potential of the first internal power supply line 202, and a source electrode of each nMOS transistor is supplied with a potential of the second internal power supply line 205.

FIG. 15 exemplarily shows a circuit diagram of the first voltage converter 105 in the system 9. The first voltage converter 105 receives at an input terminal IN thereof an output signal of the low-pass filter 113.

FIG. 16 exemplarily shows a circuit diagram of the second voltage converter 106 in the system 9. The second voltage converter 106 receives at an input terminal IN thereof an output signal of the current detection circuit 108.

FIG. 17 exemplarily shows a circuit diagram of the current detection circuit 108 in the system 9.

As shown in FIG. 10, in the system 9, a delay time between input and output of the first delay circuit 114 and a delay time between input and output of the second delay circuit 115 are controlled for a match therebetween, by a combination of the phase comparator 111, the charge pump circuit 112, the low-pass filter 113 and the first voltage converter 105.

Further, an on-state current of the sample nMOS transistor 110 is controlled as desirable, by a combination of the current detection circuit 108 and the second voltage converter 106.

The first internal power supply line 202 has a potential developed thereon by a combination of the first power source 301 and the first voltage converter 105. The second internal power supply line 205 has a potential developed thereon by a combination of the second power source 302 and the second voltage converter 106.

In each nMOS transistor, the threshold voltage has a larger value as a substrate potential of the transistor is lower than a source potential thereof, and it has a smaller value as the substrate potential is higher than the source potential. In each pMOS transistor, the threshold voltage has a smaller value as a substrate potential of the transistor is lower than a source potential thereof, and it has a larger value as the substrate potential is higher than the source potential.

Therefore, the delay times between inputs and outputs of the first and second delay circuits 114 and 115 as well as the on-state current of the sample nMOS transistor 110 are controllable by the first and second voltage converters 105 and 106.

A compensated system comprises a CMOS circuit in which the first internal power supply line 202 and the second internal power supply line 205 have a power source side potential and a ground side potential, respectively, and the first subsidiary power supply line 203 and the second subsidiary power supply line 204 have a substrate potential of pMOS transistors and a substrate potential of nMOS transistors, respectively.

The MOS transistors in the compensated system are formed in the same fabrication process as the first nMOS transistors in the first delay circuit 114, the second pMOS transistors in the second delay circuit 115 and the nMOS transistor of the sample circuit 110. Accordingly, an action speed of the compensated system is represented by an on-state current of the sample nMOS transistor 110.

The gate width of each first pMOS transistor is sufficiently larger than that of arbitrary nMOS transistor in the compensated system to represent an action speed of the latter. Likewise, the gate width of each second nMOS transistor is sufficiently larger than that of arbitrary pMOS transistor in the compensated system to represent an action speed of the latter.

If the first voltage converter 105 is controlled by the phase comparator 111, the charge pump circuit 112 and the low-pass filter 113 so that the delay time between input and output of the first delay circuit 114 and the delay time between input and output of the second delay circuit 115 match each other, and if the second voltage converter 106 is controlled by the current detection circuit 108 so that the on-state current of the sample nMOS transistor 110 has a desirable value, it so follows in the compensated system, even when characteristics of the MOS transistors therein have a tendency to fluctuate with variations of action-controlling circumferential factors such as a temperature and a power supply voltage and due to irregular deviations of devices such as of an oxidized film thickness and a length and a width of a channel of transistor, that the substrate potential of any such MOS transistor is controlled, like the first nMOS and second pMOS transistors in basic gates of the first and second delay circuits 114 and 115 as well as the sample nMOS transistor 110, in a manner in which the delay times between inputs and outputs of the first and second delay circuits 114 and 115 and the on-state current of the sample nMOS transistor 110 that represent delay characteristics of basic gates are adjusted to desirable action speeds, thus permitting an effective compensation against the fluctuation tendency.

Moreover, when the first voltage converter 105 is controlled by the phase comparator 111, the charge pump circuit 112 and the low-pass filter 113 so that the delay time between input and output of the first delay circuit 114 and the delay time between input and output of the second delay circuit 115 equal each other, respective associated MOS transistors have their substrate potentials controlled such that the first nMOS transistors and the second pMOS transistors have a matching action speed.

In a conventional CMOS circuit, as a saturation current of an nMOS transistor identical in channel length, channel width and fabrication process to a pMOS transistor was about a double of a saturation current of the pMOS transistor, it was necessary for a match between a rise time and a fall time of signals to provide the pMOS transistor with a channel width substantially equivalent to a double of a channel width of the nMOS transistor.

However, in the semiconductor integrated circuit according to the present embodiment, there is achieved a match between a rise time and a fall time of signals, not by an optimization of channel width for a match between saturation currents of nMOS and pMOS transistors, but by controlling substrate potentials of the transistors for a match between their threshold values. Therefore, an associated increase in channel width of pMOS transistor will not cause an undue increase in load capacity.

Incidentally, the conventional compensation system shown in FIG. 1 needs a triple well structure to be formed in a semiconductor fabrication process, causing an increased produciton cost, as described.

However, the semiconductor integrated circuit including the compensation system of FIG. 10 can be formed by using a double well structure, permitting an effective deviation compensation of threshold values of pMOS transistors and nMOS transistors to a competent degree to the conventional case.

The semiconductor integrated circuit of FIG. 10 may be paired to have a first subsidiary power supply line common therebetween and a second subsidiary power supply line common therebetween, permitting a formation of a plurality of types of nMOS transistors different of thereshold value from each other without an additional step to the fabrication process.

Like effects may be achieved by the semiconductor integrated circuit of FIG. 10, as the first power source 301 and the second power source 302 are common to the third power source 303 and the fourth power source 304, respectively.

It will be seen that the circuits illustrated in FIGS. 11 to 17 are mere embodied examples for a facilitated comprehension of the invention.

Description will be made of well structures in a semiconductor substrate.

Figure 18:
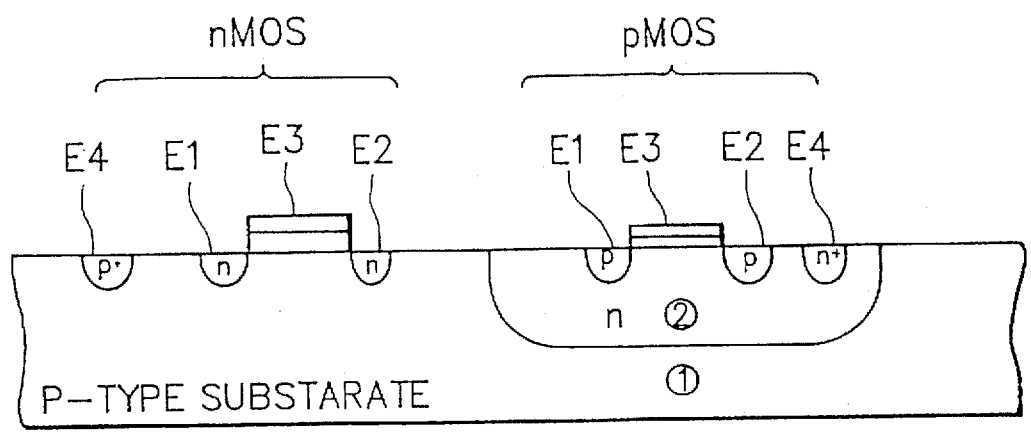
FIG. 18 is a sectional illustration of a double well structure.

FIG. 18 is a sectional view of an essential part of a semiconductor integrated circuit formed with a double well structure.

Figure 19:
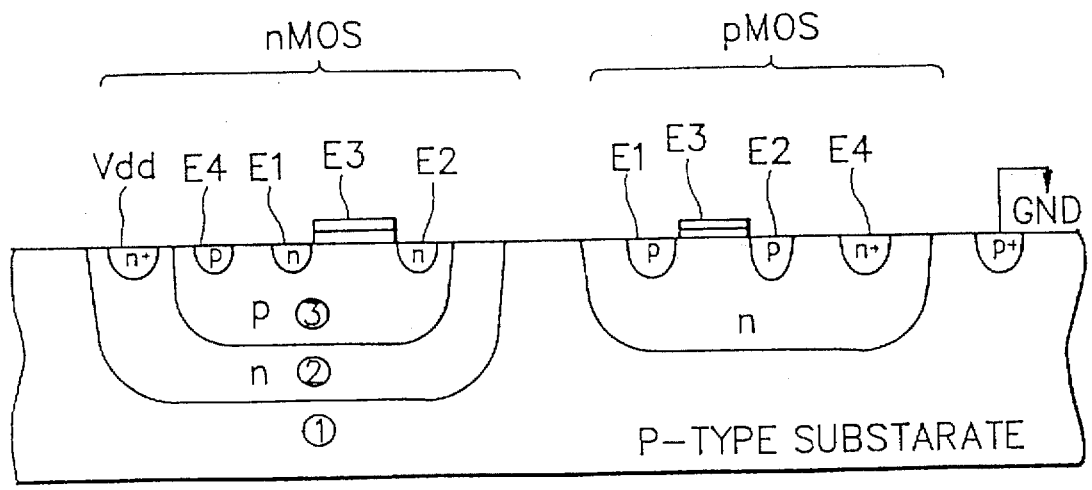
FIG. 19 is a sectional illustration of a triple well structure.

FIG. 19 is a sectional view of an essential part of a semiconductor integrated circuit formed with a triple well structure.

In FIGS. 18 and 19, numerals put in a circle represent well numbers. Designated at reference character n is an n-type region, $n^+$ is an $n^+$-region, p is a p-type region, $p^+$ is a $p^+$-region, E1 is a source electrode, E2 is a drain electrode, E3 is a gate electrode, and E4 is a substrate electrode.

In a double well structure (FIG. 18), a p→n leak current flows unless a substrate electrode E4 of an nMOS transistor is grounded (GND) or unless a substrate electrode E4 of a pMOS transistor is connected to a power supply voltage (Vdd).

A triple well structure (FIG. 19) is free from such a restriction, but needs an increased number of fabrication steps.

Incidentally, in the compensation systems 1, 2 and 4 to 9, an output signal of a phase comparator is processed through a charge pump circuit and a low-pass filter to provide a control signal for a voltage generator.

In this respect, the voltage generator may preferably be controlled with a signal directly input from the phase comparator to achieve a similar effect.

Further, it will be understood that in each embodiment described, the first internal power supply line 202 is connected to a source electrode of a respective one of pMOS transistors formed in the semiconductor circuit, the first subsidiary power supply line 203 is connected to a substrate electrode of the respective pMOS transistor, the second subsidiary power supply line 204 is connected to a substrate electrode of a respective one of nMOS transistors, and the second internal power supply line 205 is connected to the respective nMOS transistor.

As will be understood from the foregoing description of the preferred embodiments, according to the present invention, a semiconductor integrated circuit employs an effective system in which, besides a substrate potential of a MOS transistor, a power source voltage is availed for a deviation compensation via a voltage converter, making use of a PLL technique combined with a substrate effect of MOS transistor, permitting a desirable action speed to be achieved irrespective of characteristic deviations of devices as well as of circumferential variations, a plurality of transistors to work with a plurality of threshold voltage values with a reduced complexity in a semiconductor fabrication process, drive currents of nMOS and pMOS transistors to be rendered identical irrespective of their channel widths so that the channel width may be designed with a possible minimum size in available process techniques, allowing a reduced power consumption.

More specifically, according to the invention, a plurality of basic gate circuits such as inverters with typical loads are cascaded to be controlled by a PLL technique to have a desirable delay time achieved between input and output ends thereof.

The delay time through the basic gate circuits is controllable by making use of a substrate effect of an employed MOS transistor to adjust a threshold voltage thereof.

In a conventional semiconductor integrated circuit in which e.g. an inverter circuit includes an nMOS transistor and a pMOS transistor, the inverter circuit is operated by fixing respective potentials of a substrate terminal and a source terminal of the nMOS transistor to a ground potential, and those of a substrate terminal and a source terminal of the pMOS transistor to a power source potential. However, in a semiconductor integrated circuit according to the invention in which e.g. an inverter circuit includes an nMOS transistor and a pMOS transistor, a substrate terminal of the nMOS transistor is fixed to a ground potential and that of the pMOS transistor is fixed to a power source potential, while a source terminal of the nMOS transistor and that of the pMOS transistor are each respectively supplied with a voltage generated at a voltage converter controlled by a PLL technique.

Further, in a semiconductor integrated circuit according to the invention, like effects are achieved by detecting an on-state current of a sample nMOS to provide a detection signal for which a voltage converter is responsible to generate a potential to be supplied as a source potential to nMOS transistors, and by detecting an on-state current of a sample pMOS to provide another detection signal for which another voltage converter is responsible to generate a potential to be supplied as a source potential to pMOS transistors.

Still more, in a semiconductor integrated circuit according to the invention, a PLL technique is applied to a combination of a delay circuit composed of a plurality of cascaded inverter circuits each including a pMOS transistor and an nMOS transistor having a sufficiently larger channel width than the pMOS transistor and another delay circuit composed of a plurality of cascaded inverter circuits each including an nMOS transistor and a pMOS transistor having a sufficiently larger channel width than this nMOS transistor, to have a desirable delay time achieved between their inputs and outputs by controlling a voltage converter at a source end of the nMOS transistors and another voltage converter at a source end of the pMOS transistors, to adjust their threshold voltages so that the nMOS and pMOS transistors have identical drive currents irrespective of their channel widths, thus permitting their channel widths to be designed with a minimum available size in an associated semiconductor fabrication process, resulting a reduced power consumtion.

Yet more, according to the invention, a double well structure is applicable to a semiconductor integrated circuit including a deviaton compensation system, as described.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between the second power source voltage and an output voltage of a voltage converter so that the input signal to the delay circuit is delayed by a predetermined time to be output therefrom;

a phase comparator for outputting a signal depending on a difference between a phase of the signal obtained from the clock signal line and a phase of the signal output from the delay circuit;

a charge pump circuit receiving the signal output from the phase comparator, as an input thereto;

a low-pass filter receiving a signal output from the charge pump circuit, as an input thereto;

the voltage converter generating the output voltage thereof having a potential difference variable relative to the first power source voltage in dependence on a change of a signal output from the low-pass filter;

an internal signal line as a power supply line for source electrodes of remaining ones of the pMOS transistors not having the third power source voltage as a substrate voltage, the internal signal line being supplied with the output voltage of the voltage converter;

a first subsidiary power supply line for substrate electrodes of said remaining pMOS transistors, the first subsidiary power supply line being connected to the third power source; and a second subsidiary power supply line for substrate electrodes of remaining ones of the nMOS transistors not having the fourth power source voltage as a substrate voltage, the second substrate power supply line being connected to the fourth power source.

2. A deviation compensation system according to claim 1, wherein the first power source is employed in place of the third power source.

3. A deviation compensation system according to claim 1, wherein the second power source is employed in place of the fourth power source.

4. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between the first power source voltage and an output voltage of a voltage converter so that the input signal to the delay circuit is delayed by a predetermined time to be output therefrom;

a phase comparator for outputting a signal depending on a difference between a phase of the signal obtained from the clock signal line and a phase of the signal output from the delay circuit;

a charge pump circuit receiving the signal output from the phase comparator, as an input thereto;

a low-pass filter receiving a signal output from the charge pump circuit, as an input thereto;

the voltage converter generating the output voltage thereof having a potential difference variable relative to the second power source voltage in dependence on a change of a signal output from the low-pass filter;

an internal signal line as a power supply line for source electrodes of remaining ones of the pMOS transistors not having the third power source voltage as a substrate voltage, the internal signal line being supplied with the output voltage of the voltage converter;

a first subsidiary power supply line for substrate electrodes of said remaining pMOS transistors, the first subsidiary power supply line being connected to the third power source; and a second subsidiary power supply line for substrate electrodes of remaining ones of the pMOS transistors not having the fourth power source voltage as a substrate voltage, the second subsidiary power supply line being connected to the fourth power source.

5. A deviation compensation system according to claim 4, wherein the first power source is employed in place of the third power source.

6. A deviation compensation system according to claim 4, wherein the second power source is employed in place of the fourth power source.

7. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a sampled one of the pMOS transistors;

a first internal power supply line for source electrodes of remaining non-sampled ones of the pMOS transistors;

a sampled one of the nMOS transistors;

a second internal power supply line for source electrodes of remaining non-sampled ones of the nMOS transistors;

the sampled pMOS transistor having a substrate electrode thereof connected to the third power source and a drain electrode and a gate electrode thereof connected to the second internal power supply line;

a first current detection circuit for outputting a signal depending on a current conducted between a source electrode of the sampled pMOS transistor and the first internal power supply line;

a first voltage converter for generating to output a voltage having a potential difference variable relative to the first power source voltage in dependence on a change of the signal output from the first current detection circuit;

the first internal power supply line being supplied with the voltage output from the first voltage converter;

the sampled nMOS transistor having a substrate electrode thereof connected to the fourth power source and a drain electrode and a gate electrode thereof connected to the first internal power supply line;

a second current detection circuit for outputting a signal depending on a current conducted between a source electrode of the sampled nMOS transistor and the second internal power supply line;

a second voltage converter for generating to output a voltage having a potential difference variable relative to the second power source voltage in dependence on a change of the signal output from the second current detection circuit;

the second internal power supply line being supplied with the voltage output from the second voltage converter;

a first subsidiary power supply line for substrate electrodes of said remaining non-sampled pMOS transistors, the first subsidiary power supply line being connected to the third power source; and a second subsidiary power supply line for substrate electrodes of said remaining non-sampled nMOS transistors, the second subsidiary power supply line being connected to the fourth power source.

8. A deviation compensation system according to claim 7, wherein the first power source is employed in place of the third power source.

9. A deviation compensation system according to claim 7, wherein the second power source is employed in place of the fourth power source.

10. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between an output voltage of a first voltage converter and an output voltage of a second voltage converter so that the input signal to the delay circuit is delayed by a predetermined time to be output therefrom;

a phase comparator for outputting a signal depending on a difference between a phase of the signal obtained from the clock signal line and a phase of the signal output from the delay circuit;

a charge pump circuit receiving the signal output from the phase comparator, as an input thereto;

a low-pass filter receiving a signal output from the charge pump circuit, as an input thereto;

the second voltage converter generating the output voltage thereof having a potential difference variable relative to the second power source voltage in dependence on a change of a signal output from the low-pass filter;

a sampled one of the pMOS transistor;

a first internal power supply line for source electrodes of remaining non-sampled ones of the pMOS transistors;

a second internal power supply line for source electrodes of remaining non-sampled ones of the nMOS transistors;

the second internal power supply line being supplied with the output voltage of the second voltage converter;

the sampled pMOS transistor having a substrate electrode thereof connected to the third power source and a drain electrode and a gate electrode thereof connected to the second internal power supply line;

a current detection circuit for outputting a signal depending on a current conducted between a source electrode of the sampled pMOS transistor and the first internal power supply line;

the first voltage converter generating the output voltage thereof having a potential difference variable relative to the first power source voltage in dependence on a change of the signal output from the current detection circuit;

the first internal power supply line being supplied with the output voltage of the first voltage converter;

a first subsidiary power supply line for substrate electrodes of said remaining non-sampled pMOS transistors, the first subsidiary power supply line being connected to the third power source; and a second subsidiary power supply line for substrate electrodes of said remaining non-sampled nMOS transistors, the second subsidiary power supply line being connected to the fourth power source.

11. A deviation compensation system according to claim 10, wherein the first power source is employed in place of the third power source.

12. A deviation compensation system according to claim 10, wherein the second power source is employed in place of the fourth power source.

13. A deviation compensation system in a semiconductor integrated circuit including a plurality of pMOS transistors and a plurality nMOS transistors, the system comprising:

a first power source having a first power source voltage;

a second power source having a second power source voltage;

a third power source having a third power source voltage;

a fourth power source having a fourth power source voltage;

a delay circuit composed of a plurality of basic gates each consisting of one of the pMOS transistors having the third power source voltage as a substrate voltage thereof and one of the nMOS transistors having the fourth power source voltage as a substrate voltage thereof, the delay circuit receiving a signal obtained from a clock signal line, as an input signal thereto, and being operated with a power supply voltage equivalent to a potential difference between an output voltage of a first voltage converter and an output voltage of a second voltage converter so that the input signal to the delay circuit is delayed by a predetermined time to be output therefrom;

a phase comparator for outputting a signal depending on a difference between a phase of the signal obtained from the clock signal line and a phase of the signal output from the delay circuit;

a charge pump circuit receiving the signal output from the phase comparator, as an input thereto;

a low-pass filter receiving a signal output from the charge pump circuit, as an input thereto;

the first voltage converter generating the output voltage thereof having a potential difference variable relative to the first power source voltage in dependence on a change of a signal output from the low-pass filter;

a first internal power supply line for source electrodes of remaining ones of the pMOS transistors not having the third power source voltage as a substrate voltage;

the first internal power supply line being supplied with the output voltage of the first voltage converter;

a sampled one of the nMOS transistor;

a second internal power supply line for source electrodes of remaining ones of the nMOS transistors not having the fourth power source voltage as a substrate voltage;

the sampled nMOS transistor having a substrate electrode thereof connected to the fourth power source and a drain electrode and a gate electrode thereof connected to the first internal power supply line;

a current detection circuit for outputting a signal depending on a current conducted between a source electrode of the sampled nMOS transistor and the second internal power supply line;

the second voltage converter generating the output voltage thereof having a potential difference variable relative to the second power source voltage in dependence on a change of the signal output from the current detection circuit;

the second internal power supply line being supplied with the output voltage of the second voltage converter;

a first subsidiary power supply line for substrate electrodes of said remaining pMOS transistors, the first subsidiary power supply line being connected to the third power source; and a second subsidiary power supply line for substrate electrodes of said remaining nMOS transistors, the second subsidiary power supply line being connected to the fourth power source.

14. A deviation compensation system according to claim 13, wherein the first power source is employed in place of the third power source.

15. A deviation compensation system according to claim 13, wherein the second power source is employed in place of the fourth power source.

16. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first delay circuit receiving a signal obtained from a clock signal line, as an input signal thereto, and being operated with a power supply voltage substantially equivalent to a potential difference between and output voltage of a first voltage converter and an output voltage of a second voltage converter so that the input signal to the first delay circuit is delayed by a first predetermined time to be output therefrom;

a first phase comparator for outputting a signal depending on a difference between a phase of the signal obtained from the clock signal line and a phase of the signal output from the first delay circuit;

a first charge pump circuit receiving the signal output from the first phase comparator, as an input thereto;

a first low-pass filter receiving a signal output from the first charge pump circuit, as an input thereto;

the second voltage converter generating the output voltage thereof having a potential difference variable relative to the second power source voltage in dependence on a change of a signal output from the first low-pass filter;

a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second pMOS transistor having a larger gate width than the second nMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom;

a third delay circuit composed of a plurality of third basic gates each consisting of a third one of the pMOS transistors having the third power source voltage as a substrate voltage thereof and a third one of the nMOS transistors having the fourth power source voltage as a substrate voltage thereof, the third nMOS transistor having a larger gate width than the third pMOS transistor, the third delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the third delay circuit is delayed by a third predetermined time to be output therefrom;

a second phase comparator for outputting a signal depending on a difference between a phase of the signal output from the second delay circuit and a phase of the signal output from the third delay circuit;

a second charge pump circuit receiving the signal output from the second phase comparator, as an input thereto;

a second low-pass filter receiving a signal output from the second charge pump circuit, as an input thereto;

the first voltage converter generating the output voltage thereof having a potential difference variable relative to the first power source voltage in dependence on a change of a signal output from the second low-pass filter;

a first internal power supply line for source electrodes of remaining ones of the pMOS transistors not having the third power source voltage as a substrate voltage;

the first internal power supply line being supplied with the output voltage of the first voltage converter;

a second internal power supply line for source electrodes of remaining ones of the nMOS transistors not having the fourth power source voltage as a substrate voltage;

the second internal power supply line being supplied with the output voltage of the second voltage converter;

a first subsidiary power supply line for substrate electrodes of said remaining pMOS transistors, the first subsidiary power supply line being connected to the third power source; and a second subsidiary power supply line for substrate electrodes of said remaining nMOS transistors, the second subsidiary power supply line being connected to the fourth power source.

17. A deviation compensation system according to claim 16, wherein the first power source is employed in place of the third power source.

18. A deviation compensation system according to claim 16, wherein the second power source is employed in place of the fourth power source.

19. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first delay circuit receiving a signal obtained from a clock signal line, as an input signal thereto, and being operated with a power supply voltage substantially equivalent to a potential difference between an output voltage of a first voltage converter and an output voltage of a second voltage converter so that the input signal to the first delay circuit is delayed by a first predetermined time to be output therefrom;

a first phase comparator for outputting a signal depending on a difference between a phase of the signal obtained from the clock signal line and a phase of the signal output from the first delay circuit;

a first charge pump circuit receiving the signal output from the first phase comparator, as an input thereto;

a first low-pass filter receiving a signal output from the first charge pump circuit, as an input thereto;

the first voltage converter generating the output voltage thereof having a potential difference variable relative to the first power source voltage in dependence on a change of a signal output from the first low-pass filter;

a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second pMOS transistor having a larger gate width than the second nMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom;

a third delay circuit composed of a plurality of third basic gates each consisting of a third one of the pMOS transistors having the third power source voltage as a substrate voltage thereof and a third one of the nMOS transistors having the fourth power source voltage as a substrate voltage thereof, the third nMOS transistor having a larger gate width than the third pMOS transistor, the third delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the third delay circuit is delayed by a third predetermined time to be output therefrom;

a second phase comparator for outputting a signal depending on a difference between a phase of the signal output from the second delay circuit and a phase of the signal output from the third delay circuit;

a second charge pump circuit receiving the signal output from the second phase comparator, as an input thereto;

a second low-pass filter receiving a signal output from the second charge pump circuit, as an input thereto;

the second voltage converter generating the output voltage thereof having a potential difference variable relative to the second power source voltage in dependence on a change of a signal output from the second low-pass filter;

a first internal power supply line for source electrodes of remaining ones of the pMOS transistors not having the third power source voltage as a substrate voltage;

the first internal power supply line being supplied with the output voltage of the first voltage converter;

a second internal power supply line for source electrodes of remaining ones of the nMOS transistors not having the fourth power source voltage as a substrate voltage;

the second internal power supply line being supplied with the output voltage of the second voltage converter;

a first subsidiary power supply line for substrate electrodes of said remaining pMOS transistors, the first subsidiary power supply line being connected to the third power source; and a second subsidiary power supply line for substrate electrodes of said remaining nMOS transistors, the second subsidiary power supply line being connected to the fourth power source.

20. A deviation compensation system according to claim 19, wherein the first power source is employed in place of the third power source.

21. A deviation compensation system according to claim 19, wherein the second power source is employed in place of the fourth power source.

22. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a first internal power supply line supplied with an output voltage of a first voltage converter;

a second internal power supply line supplied with an output voltage of a second voltage converter;

a sampled one of the pMOS transistors having a substrate electrode thereof connected to the third power source and a drain electrode and a gate electrode thereof connected to the second internal power supply line;

a current detection circuit for outputting a signal depending on a current conducted between a source electrode of the sampled pMOS transistor and the first internal power supply line;

the first voltage converter generating the output voltage thereof having a potential difference variable relative to the first power source voltage in dependence on a change of the signal output from the current detection circuit;

a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first pMOS transistor having a larger gate width than the first nMOS transistor, the first delay circuit receiving a signal obtained from a clock signal line, as an input signal thereto, and being operated with a power supply voltage substantially equivalent to a potential difference between the output voltage of the first voltage converter and the output voltage of the second voltage converter so that the input signal to the first delay circuit is delayed by a first predetermined time to be output therefrom;

a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second nMOS transistor having a larger gate width than the second pMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom;

a phase comparator for outputting a signal depending on a difference between a phase of the signal output from the first delay circuit and a phase of the signal output from the second delay circuit;

a charge pump circuit receiving the signal output from the phase comparator, as an input thereto;

a low-pass filter receiving a signal output from the charge pump circuit, as an input thereto;

a second voltage converter generating the output voltage thereof having a potential difference variable relative to the second power source voltage in dependence on a change of a signal output from the low-pass filter;

the first internal power supply line being provided as a power supply line for source electrodes of remaining ones of the pMOS transistors not having the third power source voltage as a substrate voltage;

a second internal power supply line being provided as a power supply line for source electrodes of remaining ones of the nMOS transistors not having the fourth power source voltage as a substrate voltage;

a first subsidiary power supply line for substrate electrodes of said remaining pMOS transistors, the first subsidiary power supply line being connected to the third power source; and a second subsidiary power supply line for substrate electrodes of said remaining nMOS transistors, the second subsidiary power supply line being connected to the fourth power source.

23. A deviation compensation system according to claim 22, wherein the first power source is employed in place of the third power source.

24. A deviation compensation system according to claim 22, wherein the second power source is employed in place of the fourth power source.

25. A deviation compensation system in a semiconductor integrated circuit including a plurality of pMOS transistors and a plurality of nMOS transistors, the system comprising:

a first power source having a first power source voltage;

a second power source having a second power source voltage;

a third power source having a third power source voltage;

a fourth power source having a fourth power source voltage;

a first internal power supply line supplied with an output voltage of a first voltage converter;

a second internal power supply line supplied with an output voltage of a second voltage converter;

a sampled one of the nMOS transistors having a substrate electrode thereof connected to the fourth power source and a drain electrode and a gate electrode thereof connected to the first internal power supply line;

a current detection circuit for outputting a signal depending on a current conducted between a source electrode of the sampled nMOS transistor and the second internal power supply line;

the second voltage converter generating the output voltage thereof having a potential difference variable relative to the second power source voltage in dependence on a change of the signal output from the current detection circuit;

a first delay circuit composed of a plurality of first basic gates each consisting of a first one of the pMOS transistors having the third power source voltage as a substrate voltage thereof and a first one of the nMOS transistors having the fourth power source voltage as a substrate voltage thereof, the first pMOS transistor having a larger gate width than the first nMOS transistor, the first delay circuit receiving a signal obtained from a clock signal line, as an input signal thereto, and being operated with a power supply voltage substantially equivalent to a potential difference between the output voltage of the first voltage converter and the output voltage of the second voltage converter so that the input signal to the first delay circuit is delayed by a first predetermined time to be output therefrom;

a second delay circuit composed of a plurality of second basic gates each consisting of a second one of the pMOS transistors having the third power source voltage as a substrate voltage thereof and a second one of the nMOS transistors having the fourth power source voltage as a substrate voltage thereof, the second nMOS transistor having a larger gate width than the second pMOS transistor, the second delay circuit receiving the signal obtained from the clock signal line, as an input signal thereto, and being operated with a power supply voltage substantially equivalent to the potential difference between the output voltage of the first voltage converter and the output voltage of the second voltage converter so that the input signal to the second delay circuit is delayed by a second predetermined time to be output therefrom;

a phase comparator for outputting a signal depending on a difference between a phase of the signal output from the first delay circuit and a phase of the signal output from the second delay circuit;

a charge pump circuit receiving the signal output from the phase comparator, as an input thereto;

a low-pass filter receiving a signal output from the charge pump circuit, as an input thereto;

the first voltage converter generating the output voltage thereof having a potential difference variable relative to the first power source voltage in dependence on a change of a signal output from the low-pass filter;

the first internal power supply line being provided as a power supply line for source electrodes of remaining ones of the pMOS transistors not having the third power source voltage as a substrate voltage;

the second internal power supply line being provided as a power supply line for source electrodes of remaining ones of the nMOS transistors not having the fourth power source voltage as a substrate voltage;

a first subsidiary power supply line for substrate electrodes of said remaining pMOS transistors, the first subsidiary power supply line being connected to the third power source; and a second subsidiary power supply line for substrate electrodes of said remaining nMOS transistors, the second subsidiary power supply line being connected to the fourth power source.

26. A deviation compensation system according to claim 25, wherein the first power source is employed in place of the third power source.

27. A deviation compensation system according to claim 25, wherein the second power source is employed in place of the fourth power source.

* * * * *